US011508936B2

(12) United States Patent
Kang et al.

(10) Patent No.: US 11,508,936 B2
(45) Date of Patent: Nov. 22, 2022

(54) DISPLAY DEVICE INCLUDING BLOCK PATTERNS

(71) Applicant: SAMSUNG DISPLAY CO., LTD., Yongin-si (KR)

(72) Inventors: Chul Kyu Kang, Suwon-si (KR); Dae Suk Kim, Seongnam-si (KR); Seon Kyoon Mok, Hwaseong-si (KR); Il Goo Youn, Asan-si (KR); Dong Sun Lee, Hwaseong-si (KR); So Young Lee, Asan-si (KR); Ji Eun Lee, Seoul (KR); Jun Young Jo, Hwaseong-Gyeonggi-do (KR); Min Hee Choi, Hwaseong-Gyeonggi-do (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/924,176

(22) Filed: Jul. 8, 2020

(65) Prior Publication Data

US 2021/0175470 A1 Jun. 10, 2021

(30) Foreign Application Priority Data

Dec. 4, 2019 (KR) .......................... 10-2019-0159957

(51) Int. Cl.
*H01L 27/14* (2006.01)
*H01L 27/32* (2006.01)
(Continued)

(52) U.S. Cl.
CPC ...... *H01L 51/5253* (2013.01); *H01L 51/0097* (2013.01); *G02F 1/133331* (2021.01);
(Continued)

(58) Field of Classification Search
CPC ............ H01L 51/5253; H01L 51/0097; H01L 2251/5338; H01L 2251/301;
(Continued)

(56) References Cited

U.S. PATENT DOCUMENTS

2015/0060806 A1* 3/2015 Park .................... H01L 27/3246
257/40
2016/0307971 A1* 10/2016 Jeon ..................... G09G 3/3233
(Continued)

FOREIGN PATENT DOCUMENTS

KR 10-2012-0093800 8/2012

*Primary Examiner* — Ida M Soward
(74) *Attorney, Agent, or Firm* — F. Chau & Associates, LLC

(57) ABSTRACT

A display device includes a substrate on which an active region and a non-active region disposed are defined. The non-active region at least partially surrounds the active region. A light-emitting element is disposed in the active region on the substrate. An encapsulation layer is disposed on the light-emitting element. Block patterns are disposed in the non-active region on the substrate and at least partially surround the active region. The non-active region includes a first non-active region positioned at a first side of the active region and a second non-active region positioned at a second side of the active region. There are more block patterns disposed in the first non-active region than in the second non-active region.

18 Claims, 21 Drawing Sheets

(51) Int. Cl.
- *H01L 33/44* (2010.01)
- *H01L 51/00* (2006.01)
- *H01L 51/52* (2006.01)
- *G02F 1/133* (2006.01)
- *G06F 1/16* (2006.01)
- *G09F 9/30* (2006.01)
- *H01L 27/146* (2006.01)
- *G02F 1/1335* (2006.01)
- *G02F 1/1333* (2006.01)

(52) U.S. Cl.
CPC .. *G02F 1/133514* (2013.01); *G02F 1/133528* (2013.01); *G06F 1/1641* (2013.01); *G06F 1/1652* (2013.01); *G09F 9/301* (2013.01); *G09G 2300/0408* (2013.01); *G09G 2300/0804* (2013.01); *H01L 27/14678* (2013.01); *H01L 27/323* (2013.01); *H01L 27/3246* (2013.01); *H01L 27/3258* (2013.01); *H01L 33/44* (2013.01); *H01L 51/5293* (2013.01); *H01L 2251/301* (2013.01); *H01L 2251/5338* (2013.01)

(58) Field of Classification Search
CPC . H01L 27/14678; H01L 33/44; H01L 27/323; H01L 27/3246; H01L 27/3258; H01L 27/3244; H01L 27/32; H01L 27/3297; H01L 27/3295; H01L 51/5256; H01L 51/5246; H01L 51/5293; H01L 2251/558; G02F 1/133528; G02F 1/133331; G02F 2001/136222; G06F 1/1641; G06F 1/1652; G09F 9/301; G09G 2300/0408; G09G 2300/0804

See application file for complete search history.

(56) References Cited

U.S. PATENT DOCUMENTS

| | | | |
|---|---|---|---|
| 2017/0052397 A1* | 2/2017 | Kim | G02F 1/133707 |
| 2017/0287995 A1* | 10/2017 | Kim | H01L 27/3276 |
| 2017/0365814 A1* | 12/2017 | Kim | H01L 27/3276 |
| 2018/0061728 A1* | 3/2018 | Chen | H01L 27/3276 |
| 2019/0006431 A1* | 1/2019 | Won | H01L 27/323 |
| 2019/0058021 A1* | 2/2019 | Kim | G09G 3/3275 |
| 2019/0153318 A1* | 5/2019 | Park | H01L 51/5234 |
| 2019/0157618 A1* | 5/2019 | Park | H01L 51/5253 |
| 2019/0189956 A1* | 6/2019 | Park | H01L 51/5246 |
| 2019/0280053 A1* | 9/2019 | Oh | H01L 27/3258 |
| 2019/0296099 A1* | 9/2019 | Lee | H01L 27/3258 |
| 2019/0326360 A1* | 10/2019 | Gwon | H01L 27/3276 |
| 2019/0363290 A1* | 11/2019 | Watanabe | H05B 33/02 |
| 2020/0091256 A1* | 3/2020 | Kim | H01L 51/5253 |
| 2020/0127220 A1* | 4/2020 | Kim | H01L 51/5012 |
| 2020/0150847 A1* | 5/2020 | Jang | G06F 3/0446 |
| 2020/0152727 A1* | 5/2020 | Shin | H01L 27/3279 |
| 2020/0168685 A1* | 5/2020 | Bang | H01L 27/3276 |
| 2020/0185647 A1* | 6/2020 | Lee | G09G 3/3266 |
| 2020/0219952 A1* | 7/2020 | Kim | H01L 27/3276 |
| 2020/0350393 A1* | 11/2020 | Lhee | H01L 51/5253 |
| 2021/0066649 A1* | 3/2021 | Wang | H01L 51/5253 |
| 2021/0351378 A1* | 11/2021 | Lee | H01L 51/5253 |
| 2021/0408458 A1* | 12/2021 | Lu | H01L 51/5253 |

\* cited by examiner

DISPLAY DEVICE INCLUDING BLOCK PATTERNS

This application claims priority under 35 U.S.C. § 119 to Korean Patent Application No. 10-2019-0159957 filed on Dec. 4, 2019 in the Korean Intellectual Property Office, the disclosure of which is incorporated by reference herein in its entirety.

TECHNICAL FIELD

The present disclosure relates to a display device and, more particularly, to a display device including block patterns.

DISCUSSION OF THE RELATED ART

Electronic devices, such as smartphones, tablet computers, digital cameras, laptop and notebook computers, navigation devices, and smart televisions include display devices for displaying images. The display device includes a display panel configured to generate and display images. The display device may further include one or more input devices such as a touch panel, a camera sensor, etc.

Recently, in order to reduce a thickness of a display device and to allow the display device to be bent or folded, thin film encapsulation structures including a thin and flexible material can be applied as encapsulation structures for sealing a light-emitting element of the display panel.

Meanwhile, when the thin film encapsulation structure is formed, a block pattern may be formed to control reflow of the flexible material. While a large number of block patterns may help to control reflow, the additional block patterns may increase a dead space of the display panel.

SUMMARY

A display device includes a substrate on which an active region and a non-active region disposed around the active region are defined. A light-emitting element is disposed in the active region on the substrate. An encapsulation layer is disposed on the light-emitting element. Block patterns disposed are disposed in the non-active region on the substrate and surrounding the active region in a plan view. The non-active region includes a first non-active region positioned at a first side of the active region and a second non-active region positioned at a second side of the active region. The number of the block patterns disposed in the first non-active region is greater than the number of the block patterns disposed in the second non-active region.

A planar shape of the block patterns may be a closed curve.

The encapsulation layer may include a first inorganic encapsulation layer, an organic encapsulation layer on the first inorganic encapsulation layer, and a second inorganic encapsulation layer on the organic encapsulation layer. The organic encapsulation layer may be disposed inside of the block patterns.

The block patterns disposed in the first non-active region may include a first block pattern, a second block pattern spaced apart from the active region with the first block pattern interposed therebetween, and a third block pattern spaced apart from the first block pattern with the second block pattern interposed therebetween.

The block patterns disposed in the second non-active region may include a fourth block pattern and a fifth block pattern. The fifth block pattern may be spaced apart from the active region with the fourth block pattern interposed therebetween.

The first block pattern may be physically connected to the fourth block pattern, and the third block pattern may be physically connected to the fifth block pattern.

The second block pattern may be physically connected to the fourth block pattern.

A planar shape of the active region may be a rectangular shape having round corners, a pair of short sides, and a pair of long sides. The first non-active region may be disposed adjacent to one short side of the active region, and the second non-active region may be disposed adjacent to one long side of the active region.

The non-active region may further include a third non-active region disposed between the first non-active region and the second non-active region and disposed adjacent to the round corner of the active region. The second block pattern and the fourth block pattern may be physically connected to each other in the first non-active region or the third non-active region.

The first non-active region may further include a bending region. The bending region may be spaced apart from the active region with the third block pattern interposed therebetween in a plan view.

In the bending region, the display device may be bent in a thickness direction thereof.

The third block pattern may have a first stacked structure in which a first organic layer is stacked on the substrate, a second organic layer is stacked on the first organic layer, and a third organic layer is stacked on the second organic layer. The first block pattern and the second block pattern may each have a second stacked structure in which the second organic layer and the third organic layer are stacked.

The display device may further include a fourth organic layer disposed in the bending region on the substrate. The fourth organic layer may be in contact with the substrate and may include a same material as that of the first organic layer.

The second block pattern may be physically connected to the fifth block pattern.

A surface height of the third block pattern may be greater than each of a surface height of the first block pattern and a surface height of the second block pattern. A surface height of the fifth block pattern may be greater than a surface height of the fourth block pattern.

The organic encapsulation layer may be disposed inside of the third block pattern and inside of the fifth block pattern. The first inorganic encapsulation layer may be in direct contact with the first block pattern, the second block pattern, and the third block pattern.

A display device includes a substrate on which an active region and a non-active region disposed around the active region are defined. A light-emitting element is disposed in the active region on the substrate. An encapsulation layer is disposed on the light-emitting element. Block patterns are disposed in the non-active region on the substrate and surrounding the active region in a plan view. The non-active region includes a first non-active region positioned at a first side of the active region and a second non-active region positioned at a second side of the active region. The block patterns have a closed curve shape completely surrounding the active region in a plan view. A number of the block patterns disposed in the first non-active region is greater than a number of the block patterns disposed in the second non-active region.

The encapsulation layer may include a first inorganic encapsulation layer, an organic encapsulation layer on the first inorganic encapsulation layer, and a second inorganic encapsulation layer on the organic encapsulation layer. The organic encapsulation layer may be disposed inside of the block patterns. The block patterns disposed in the first non-active region may include a first block pattern, a second block pattern spaced apart from the active region with the first block pattern interposed therebetween, and a third block pattern spaced apart from the first block pattern with the second block pattern interposed therebetween.

The block patterns disposed in the second non-active region may include a fourth block pattern and a fifth block pattern spaced apart from the active region with the fourth block pattern interposed therebetween. The first block pattern may be physically connected to the fourth block pattern. The third block pattern may be physically connected to the fifth block pattern.

The second block pattern may be physically connected to the fourth block pattern.

BRIEF DESCRIPTION OF THE DRAWINGS

The above and other aspects and features of the present disclosure will become more apparent by describing exemplary embodiments thereof in detail with reference to the attached drawings, in which.

DETAILED DESCRIPTION OF THE EMBODIMENTS

Figure 1:
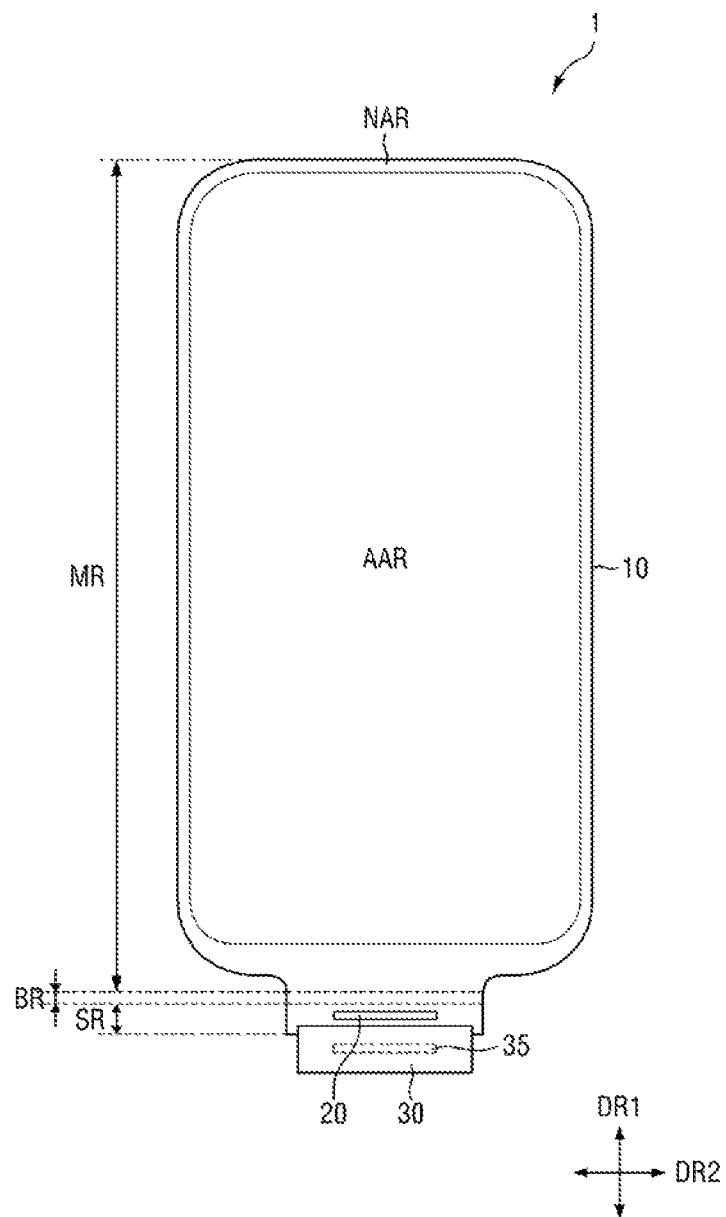
FIG. 1 is a plan view illustrating a display device according to an exemplary embodiment of the present disclosure.

Specific structural and functional descriptions of embodiments of the invention disclosed herein are provided for illustrative purposes of the embodiments of the invention. The invention may be embodied in many different forms without departing from the spirit and significant characteristics of the invention. Therefore, the embodiments of the invention are disclosed for illustrative purposes and should not necessarily be construed as limiting the invention.

It will be understood that when an element is referred to as being related to another element such as being "coupled" or "connected" to another element, it can be directly coupled or connected to the other element or intervening elements may be present therebetween. Other expressions that explain the relationship between elements, such as "between," "directly between," "adjacent to," or "directly adjacent to" should be construed in the same way.

Throughout the specification, the same reference numerals may refer to the same or like parts.

It will be understood that, although the terms "first," "second," "third" etc. may be used herein to describe various elements, components, regions, layers and/or sections, these elements, components, regions, layers and/or sections should not necessarily be limited by these terms. These terms are used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments and is not necessarily intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and or" includes any and all combinations of one or more of the associated listed items. It will be further understood that the terms "comprises" and/or "comprising." or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper." depending on the particular orientation of the figure. Similarly, if the device in one of the figures is turned over, elements described as "below" or "beneath" oilier elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Exemplary embodiments of the present disclosure are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not necessarily be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded.

Hereinafter, embodiments of the invention will be described with reference to the attached drawings.

Figure 2:
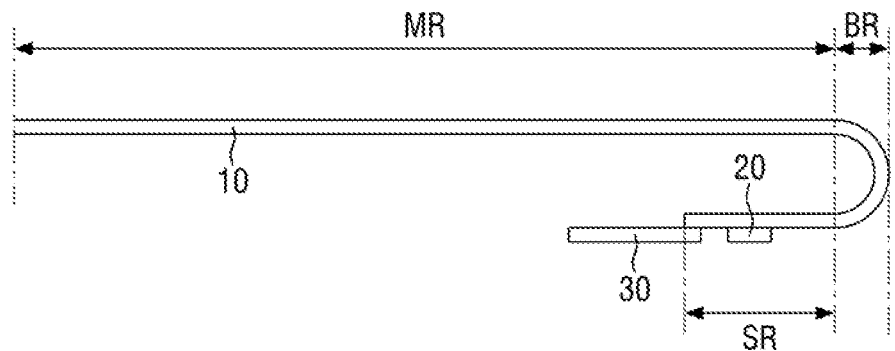
FIG. 2 is a schematic partial cross-sectional view illustrating the display device according to one exemplary embodiment of the present disclosure.

FIG. 1 is a plan view illustrating a display device according to one exemplary embodiment of the present disclosure, and FIG. 2 is a schematic partial cross-sectional view of the display device according to one exemplary embodiment of the present disclosure.

In exemplary embodiments of the present disclosure, a first direction DR1 and a second direction DR2 are different directions and intersect each other. In the plan view of FIG. 1, for convenience of description, the first direction DR1 is defined as a vertical direction, and the second direction DR2 is defined as a horizontal direction. In the following exemplary embodiments of the present disclosure, one side direction of the first direction DR1 refers to an upper direction in a plan view, and the other side direction of the first direction DR1 refers to a lower direction in a plan view. One side direction of the second direction DR2 refers to a right direction in a plan view, and the other side direction of the second direction DR2 refers to a left direction in a plan view. However, directions mentioned in exemplary embodiments of the present disclosure should be understood to refer to relative directions, and the exemplary embodiments of the present disclosure are not necessarily limited to the mentioned directions.

Referring to FIGS. 1 and 2, a display device 1 may refer to any electronic device provided with a display screen. For example, the display device 1 may include a portable electronic device such as a mobile phone, a smartphone, a tablet computer, an electronic watch, a smart watch, a watch phone, a mobile communication terminal an electronic notebook, an electronic book (e-book) reader, a portable multimedia player (PMP), a navigation device, a game machine, or a digital camera, which is provided with a display screen, and may also include a television, a laptop or notebook computer, a monitor, an electronic billboard, or a device for Internet of Things (IoT).

The display device 1 may include a display region in which a screen is displayed and a non-display region in which a screen is not displayed. In terms of displaying a screen, an active region AAR including the display region and a non-active region NAR including the non-display region may be defined in the display device 1. The non-active region NAR may be positioned around the active region AAR. The non-active region NAR may at least partially surround the active region AAR in a plan view. In one exemplary embodiment of the present disclosure, the non-active region NAR may completely surround the active region AAR in a plan view.

A planar shape of the active region AAR may include a rectangle with round corners. For example, an outer profile of the active region AAR may include one short side positioned m one side direction of the first direction DR1, the other short side positioned in the other side direction of the first direction DR1, one long side positioned in one side direction of the second direction DR2, and the other long side positioned in the other side direction of the second direction DR2. The round corners may be positioned between one short side and one long side, between one short side and the other long side, between the other short side and one long side, and between the other short side and the other long side. The short sides of the active region AAR may extend primarily in the second direction DR2, and the long sides thereof may extend primarily in the first direction DR1. In the present specification, the phase "corner is round" should be understood as a concept including not only that a corner actually has a constant curvature or a variable curvature, but also that a corner is not formed of two straight lines meeting each other and is instead formed by extending a plurality of straight lines with different inclinations (different extending directions).

However, the planar shape of the active region AAR is not necessarily limited thereto. Hereinafter, a case will be mainly described in which a rectangle with round corners is applied as the planar shape of the active region AAR.

The non-active region NAR completely surrounding the active region AAR may surround the short sides, the long sides, and the round corners of the active region AAR.

In some exemplary embodiments of the present disclosure, the active region AAR may include a touch region in which a touch input is sensed, and the non-active region NAR may include a non-touch region in which a touch is not sensed but which assists in sensing a touch.

In some exemplary embodiments of the present disclosure, the active region AAR may be a region that is exactly the same as the display region and the touch region, together, and the non-active region NAR may be a region that is exactly the same as the non-display region and the non-touch region, together.

In some exemplary embodiments of the present disclosure, the non-active region NAR may partially include the display region. For example, the non-active region NAR may be a region in which the display region and the non-display region are mixed.

A plurality of pixels may be defined in the active region AAR. Each pixel thereof may include at least one thin film transistor and a light-emitting element electrically connected to the thin film transistor. For example, the thin film transistor and the light-emitting element may be disposed in the active region AAR.

Signal lines for applying electrical signals to each pixel and signal pads, which are connected to the signal lines and to which an external device configured to apply the electrical signals is attached, may be disposed in the non-active region NAR. Driving circuits may be further disposed in the non-active region NAR.

The display device 1 includes a display panel 10 provided with a display screen. Examples of the display panel 10 may include an organic light-emitting diode (OLED) display panel, a micro light-emitting diode (LED) display panel, a nano LED display panel, a quantum dot light-emitting display panel, a liquid crystal display (LCD) panel, a plasma display panel, a field emission display panel, an electrophoretic display panel, an electrowetting display panel, and the like. Hereinafter, although an example in which the organic light-emitting display panel as the example of the display panel 10 is applied is described, the present disclosure is not necessarily limited thereto, and a device to which the same technical spirit is applicable may be applied to other display panels.

The display device 1 may further include a touch member which senses a touch input. The touch member may be provided as a panel or film separate from the display panel 10 and attached onto the display panel 10 but may also be provided in the form of a touch layer inside of the display panel 10. In the following exemplary embodiments of the present disclosure, a case will be described in which the touch member is provided inside of the display panel to be included in the display panel 10, but the present disclosure is not necessarily limited thereto.

The display panel 10 may include a flexible substrate including a flexible polymer material such as polyimide. Accordingly, the display panel 10 may be flexible, bendable, foldable, or rollable. As used herein, the term "flexible" is understood to mean having the ability to be flexed to a non-trivial extent without cracking or breaking, the term "bendable" is understood to mean having the ability to be bent to a non-trivial extent without cracking or breaking, the term "foldable" is understood to mean having the ability to be folded to a non-trivial extent without cracking or breaking, and the term "rollable" is understood to mean having the ability to be rolled to a non-trivial extent without cracking or breaking. As used herein, the term "non-trivial extent" is understood to mean an extend that can be readily observed with the naked eye and can be readily appreciated as constituting a flex, bend, fold, roll, etc.

A bending region BR, which is a region in which a panel is bent, may be defined in the display panel 10. With respect to the bending region BR, a main region MR positioned at one side of the bending region BR and a sub-region SR positioned at the other side of the bending region BR may be further defined in the display panel 10.

The main region MR may have a shape that is approximately similar to a planar exterior of the display device 1. The main region MR may be a flat region positioned on one surface. However, the present disclosure is not necessarily limited thereto, and in the main region MR, at least one edge of the remaining edges except for an edge (side) connected to the bending region BR may be bent to form a curved surface or may be bent in a vertical direction.

When, in the main region MR, at least one edge of the remaining edges except for the edge (side) connected to the bending region BR forms the curved surface or is bent, a display region may be disposed even at a corresponding edge. However, the present disclosure is not necessarily limited thereto, and the curved surface or bent edge may become a non-display region in which no pixels are disposed and an image is not displayed, or a display region and a non-display region may be mixed in a corresponding region.

The bending region BR is connected to one side of the main region MR in the first direction DR1. For example, the bending region BR may be connected through a lower short side of the main region MR. A width of the bending region BR may be smaller than a width (width of a short side) of the main region MR. A connection portion between the main region MR and the bending region BR may have an L-shaped cut shape.

In the bending region BR, the display panel 10 may be bent with a curvature facing downward in a thickness direction thereof, for example, in a direction opposite to a display surface. The bending region BR may have a constant radius of curvature, but the present disclosure is not necessarily limited thereto. The bending region BR may have a different radius of curvature for each section. As the display panel 10 is bent in the bending region BR, a surface of the display panel 10 may be reversed. For example, one surface of the display panel 10 facing upward may be changed to face outward and then face downward through the bending region BR.

The sub-region SR extends from the bending region BR. For example, the sub-region SR contacts the bending region BR. The sub-region SR may extend primarily in a direction parallel to the main region MR after bending of the sub-region SR is completed. The sub-region SR may at least partially overlap the main region MR in the thickness direction of the display panel 10. A width of the sub-region SR (width in the second direction DR2) may be the same as a width of the bending region BR, but the present disclosure not necessarily limited thereto.

A first pad portion and a second pad portion may be disposed in the sub-region SR. The first pad portion may be positioned closer to the active region AAR than to the second pad portion. The second pad portion may be disposed between the active region AAR and the first pad portion. A first driving chip 20 may be disposed in the first pad portion. The first driving chip 20 may include an integrated circuit configured to drive the display panel 10. The integrated circuit may include an integrated circuit for driving/controlling a display and/or an integrated circuit for driving/controlling a touch unit. The integrated circuit for driving/controlling a display and the integrated circuit for a driving/controlling touch unit may be provided as separate chips or may be provided as parts of one chip.

The second pad portion may be disposed at an end portion of the sub-region SR of the display panel 10. The second pad portion may include a plurality of display signal line pads and a plurality of touch signal line pads. A driving substrate 30 may be connected to the second pad portion at the end portion of the sub-region SR in the display panel 10. The driving substrate 30 may be a flexible primed circuit board or a film. A second driving chip 35 may be disposed on the driving substrate 30.

The main region MR may at least partially overlap the active region AAR and a portion of the non-active region NAR adjacent to the active region AAR. For example, the main region MR may include the active region AAR and a portion of the non-active region NAR adjacent to the active region AAR.

The non-active region NAR may at least partially overlap each of the bending region BR and the sub-region SR. For example, the non-active region NAR may include the bending region BR and the sub-region SR.

Figure 3:
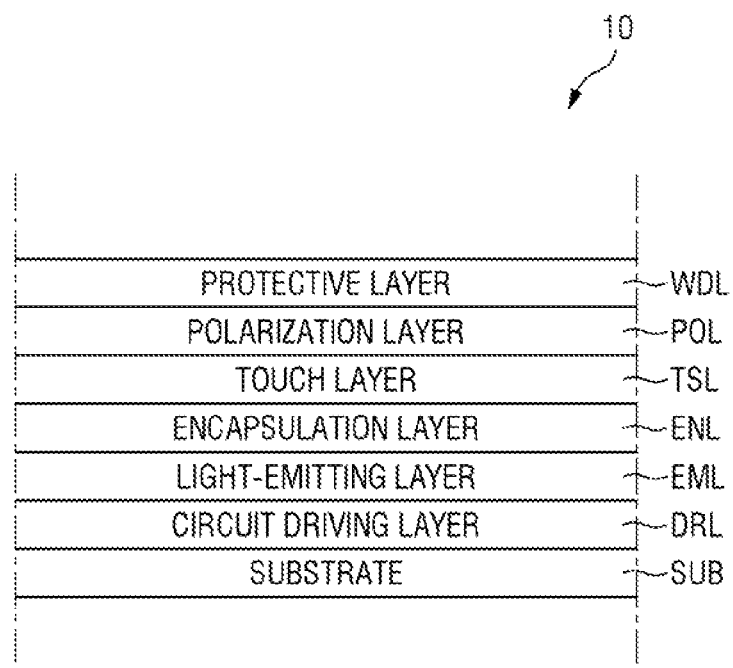
FIG. 3 is a schematic cross-sectional view illustrating an exemplary stacked structure of a display panel according to one exemplary embodiment of the present disclosure.

FIG. 3 is a schematic cross-sectional view illustrating an exemplary stacked structure of the display panel according to one exemplary embodiment of the present disclosure.

Figure 7:
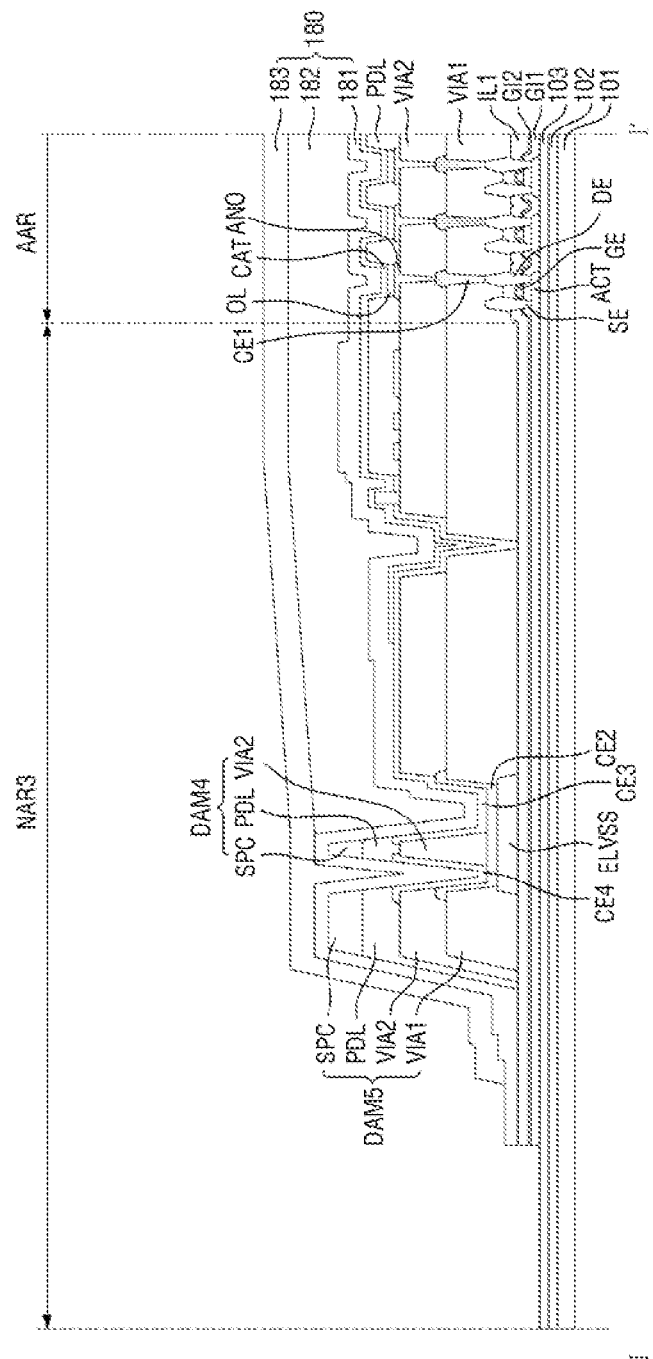
FIG. 7 is a cross-sectional view taken along line I-I' of FIG. 6.

Referring to FIG. 3, the display panel 10 may include a circuit driving layer DRL disposed on a substrate SUB (see "101" of FIG. 7). The circuit driving layer DRL may include a circuit for driving a light-emitting layer EML of the pixel. The circuit driving layer DRL may include a plurality of thin film transistors.

The light-emitting layer EML may be disposed on the circuit driving layer DRL. The light-emitting layer EML may include an organic light-emitting layer. The light-emitting layer EML may emit light with various levels of luminance according to a driving signal transmitted from the circuit driving layer DRL.

An encapsulation layer ENL may be disposed on the light-emitting layer EML. The encapsulation layer ENL may include an inorganic film or a stacked film of an inorganic film and an organic film. In an example, glass or an encapsulation film may be applied as the encapsulation layer ENL.

A touch layer TSL may be disposed on the encapsulation layer ENL. The touch layer TSL may be a layer which senses a touch input and may perform a function of a touch member. The touch layer TSL may include touch electrodes. For example, the touch electrode may be a mesh pattern or a planar pattern. In a case in which the touch electrode is the mesh pattern, even when the touch electrode includes an opaque conductive material, the mesh pattern may at least partially overlap a non-emission region (defined by a hank layer), and thus, the touch electrode might not be visible. In a case in which the touch electrode is the planar pattern, the touch electrode may include a transparent conductive material.

A polarization layer POL may be disposed on the touch layer TSL. The polarization layer POL may serve to reduce external light reflection. The polarization layer POL may be attached onto a light blocking pattern layer BML through an adhesive layer. The polarization layer POL may be omitted.

A protective layer WDL may be disposed on the polarization layer POL. The protective layer WDL may include, for example, a window member. The protective layer WDL may be attached onto the polarization layer POL through an optically transparent adhesive or the like.

In some exemplary embodiments of the present disclosure, the polarization layer POL may be omitted, and a color filter layer may be disposed on the touch layer TSL. In this case, the color filter layer may be disposed between the touch layer TSL and the protective layer WDL.

The detailed stacked structure of the display panel will be described below with reference to FIGS. 7 and 8.

Figure 4:
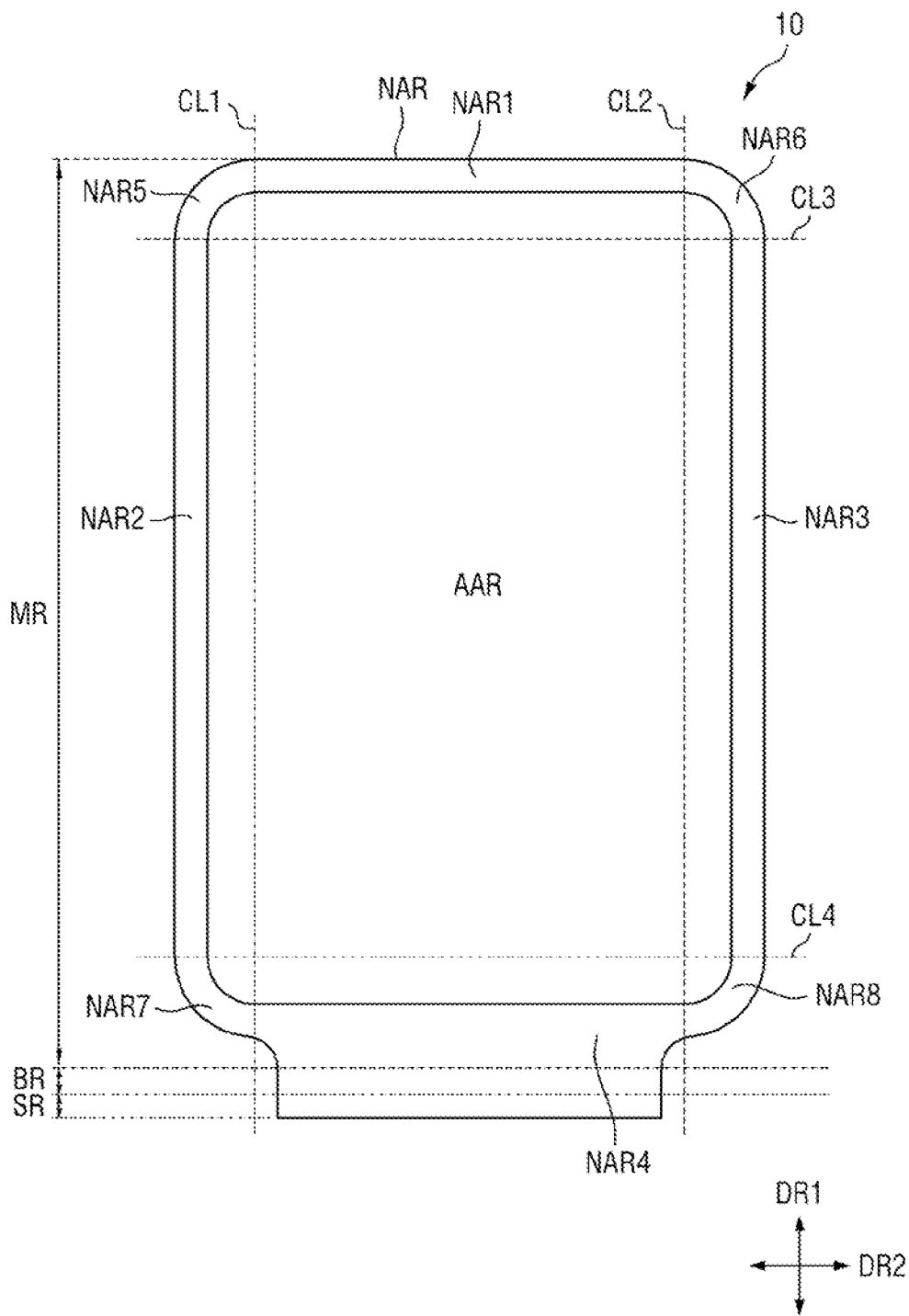
FIG. 4 is a plan view illustrating the display panel according to one exemplary embodiment of the present disclosure.

FIG. 4 is a plan view illustrating the display panel according to one exemplary embodiment of the present disclosure.

Referring to FIG. 4, the short sides, the long sides, and the corners of the outer profile of the active region AAR may be divided by first to fourth reference lines CL1 to CL4. Each of the first reference line CL1 and the second reference line CL2 may extend primarily in the first direction DRL and each of the third reference line CL3 and the fourth reference line CL4 may extend primarily in the second direction DR2. The first reference line CL1 may be positioned at a left side of the drawing, the second reference line CL2 may be positioned at a right side of the drawing, the third reference line CL3 may be positioned at an upper side of the drawing, and the fourth reference line CL4 may be positioned at a lower side of the drawing.

One short side of the outer profile of the active region AAR may be positioned between the first reference line CL1 and the second reference line CL2 and may be positioned above the third reference line CL3. The other short side of the outer profile of the active region AAR may be positioned between the first reference line CL1 and the second reference line CL2 and may be positioned below the fourth reference line CL4. One long side of the outer profile of the active region AAR may be positioned between the third reference line CL3 and the fourth reference line CL4 and may be positioned on the right of the second reference line CL2. The other long side of the outer profile of the active region AAR may be positioned between the third reference line CL3 and the fourth reference line CL4 and may be positioned on the left of the first reference line CL1.

A first corner of the active region AAR may be divided by the first reference line CL1, and the third reference line CL3 and may be positioned between one short side and the other long side of the outer profile of the active region AAR. A second corner of the active region AAR may be divided by the second reference line CL2, and the third reference line CL3 and may be positioned between one short side and one long side of the outer profile of the active region AAR. A third corner of the active region AAR may be divided by the first reference line CL1, and the fourth reference line CL4 and may be positioned between the other short side and the other long side of the outer profile of the active region AAR. A fourth corner of the active region AAR may be divided by the second reference line CL2, and the fourth reference line CL4 and may be positioned between the other short side and one long side of the outer profile of the active region AAR.

The non-active region NAR may include a plurality of regions divided according to positions relative to the active region AAR. The non-active region NAR may include first to eighth non-active regions NAR1 to NAR8.

The first non-active region NAR1 may be disposed adjacent to one short side of the outer profile of the active region AAR, and the second non-active region NAR2 may be disposed adjacent to the other long side of the outer profile of the active region AAR. The third non-active region NAR3 may be disposed adjacent to one long side of the outer profile of the active region AAR, and the fourth non-active region NAR4 may be disposed adjacent to the other short side of the outer profile of the active region AAR. The fifth non-active region NAR5 may be disposed adjacent to the first corner of the outer profile of the active region AAR, and the sixth non-active region NAR6 may be disposed adjacent to the second corner of the outer profile of the active region AAR. The seventh non-active region NAR7 may be disposed adjacent to the third corner of the outer profile of the active region AAR, and the eighth non-active region NAR8 may be disposed adjacent to the fourth corner of the outer profile of the active region AAR.

As shown in FIG. 4, a width of the fourth non-active region NAR4 (a width in the first direction DR1) may be greater than each of a width of the first non-active region NAR1 (a width in the first direction DR1), a width of the second non-active region NAR2 (a width in the second direction DR2), and a width of the third non-active region NAR3 (a width in the second direction DR2). For example, the width of the fourth non-active region NAR4 (a width in the first direction DR1) may be designed to be greater than each of the width of the first non-active region NAR1 (a width in the first direction DR1), the width of the second non-active region NAR2 (a width in the second direction DR2), and the width of the third non-active region NAR3 (a width in the second direction DR2).

Figure 5:
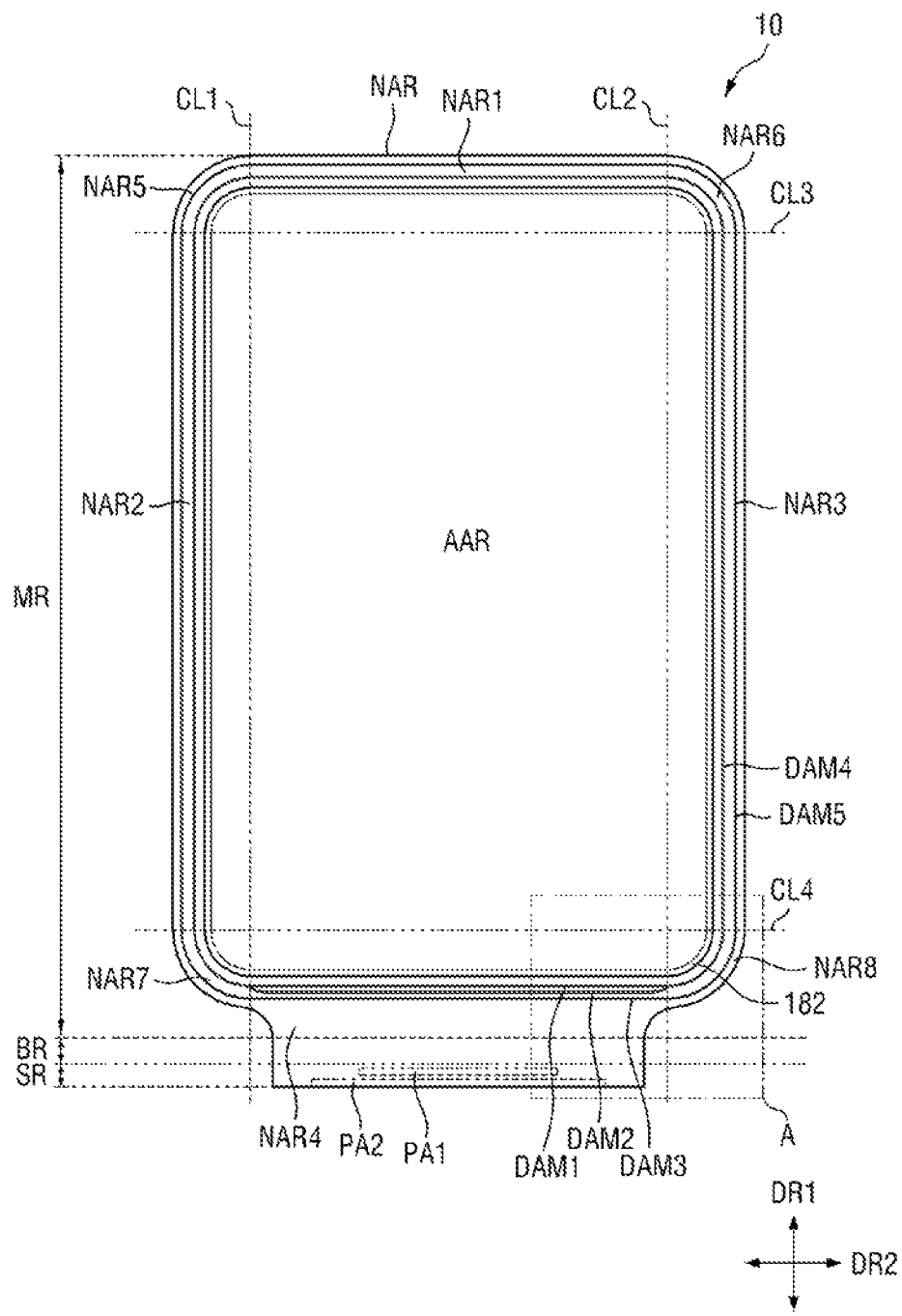
FIG. 5 is a plan view illustrating the display panel including a block pattern and an encapsulation organic layer according to one exemplary embodiment of the present disclosure.
Figure 6:
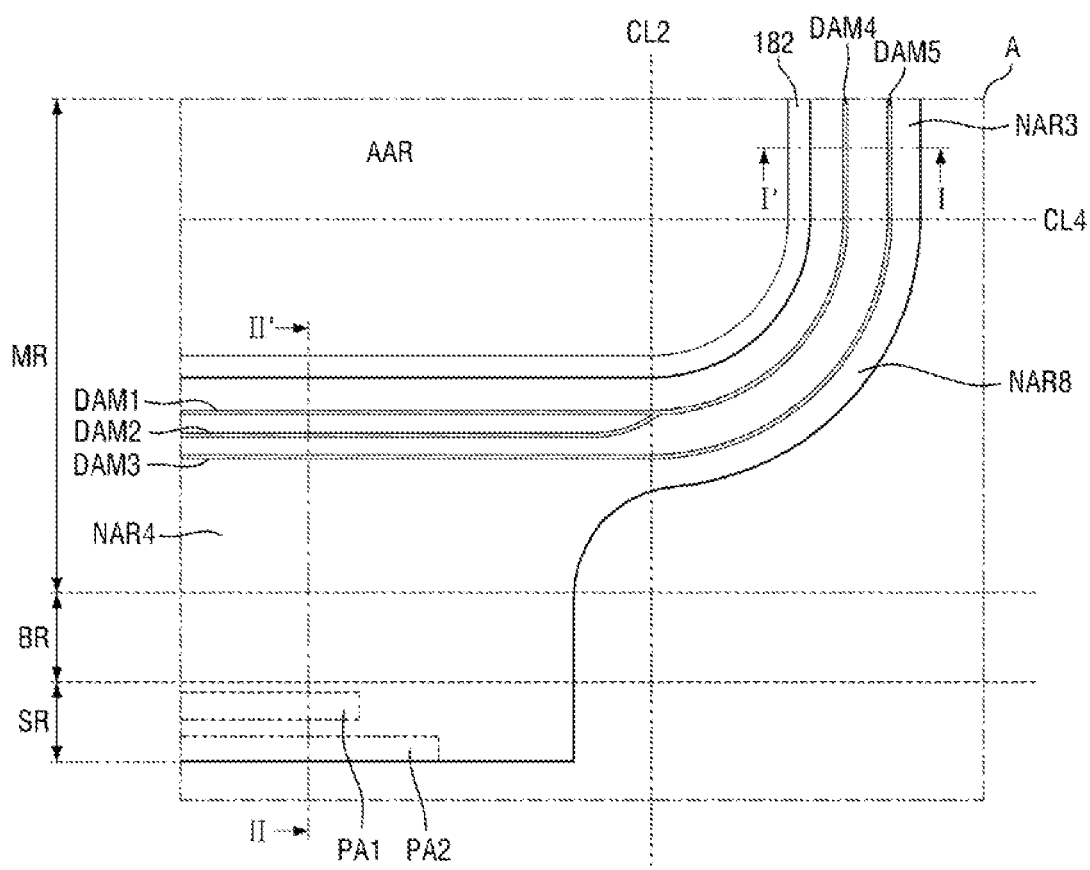
FIG. 6 is an enlarged view of region A of FIG. 5.

FIG. 5 is a plan view illustrating the display panel which illustrates a block pattern and an encapsulation organic layer according to one exemplary embodiment of the present disclosure, and FIG. 6 is an enlarged view of region A of FIG. 5.

Referring to FIGS. 5 and 6, the display panel 10 may include a plurality of block patterns and an encapsulation organic layer 182 of the encapsulation layer (see "ENL" of FIG. 3 and "180" of FIG. 7).

The encapsulation organic layer 182 may be disposed in the active region AAR and a portion of the non-active region. For example, the encapsulation organic layer 182 may be disposed not only in the active region AAR but also in portions of the first to eighth non-active regions NAR1 to NAR8 adjacent thereto.

The plurality of block patterns may completely surround the active region AAR in a plan view. For example, the plurality of block patterns may form a closed curve completely surrounding the active region AAR in a plan view. For example, each of the plurality of block patterns may circumscribe the active region AAR.

The plurality of block patterns forming the closed curve may completely surround the encapsulation organic layer 182 in a plan view. After a first encapsulation inorganic layer (see "181" of FIG. 7) is formed, an encapsulation organic layer material is formed on the first encapsulation inorganic layer 181. In this case, the encapsulation organic layer material may be reflowed in an outward direction of the display panel 10 (direction from the active region AAR to the non-active region). The plurality of block patterns may form the closed curve completely surrounding the encapsulation organic layer material in a plan view, thereby mitigating the reflow of the encapsulation organic layer material in the outward direction of the display panel 10.

As the number or height of the block patterns is increased, the reflow of the encapsulation organic layer material may be properly mitigated. However, in order to mitigate the reflow of the encapsulation organic layer material, when the height of the block pattern is increased, an overall thickness of the display device 1 is increased to reverse the thinning of the display device 1. Thus, it is possible to take into account that the number of the block patterns is increased.

However, the block patterns may be disposed in the non-active regions, and when the number of the block patterns is increased, a width of a non-active region, in which the corresponding block patterns of which the number is increased are disposed, may be increased. Thus, a region in which a screen is not displayed may be considerably increased so that a dead space may be increased.

As described above with reference to FIG. 4, according to one exemplary embodiment of the present disclosure, the width of the fourth non-active region NAR4 (a width in the first direction DR1) may be designed to be greater than each of the width of the first non-active region NAR1 (a width in the first direction DR1), the width of the second non-active region NAR2 (a width in the second direction DR2), and the width of the third non-active region NAR3 (a width in the second direction DR2).

Therefore, in terms of mitigating the reflow of the encapsulation organic layer material and in terms of reducing the dead space, it is possible to first take into account a method in which the number of the block patterns is further increased in the fourth non-active region NAR4 having a relatively wide free space for increasing the number of the block patterns, thereby mitigating the reflow of the encapsulation organic layer material in at least the fourth non-active region NAR4.

In the display panel 10 according to one exemplary embodiment of the present disclosure, the number of the block patterns disposed in the fourth non-active region NAR4 may be different from the number of the block patterns disposed in the first to third non-active regions NAR1 to NAR3. The number of the block patterns disposed in the fourth non-active region NAR4 may be more than the number of the block patterns disposed in the first to third non-active regions NAR1 to NAR3.

A first block pattern DAM1 closest to the encapsulation organic layer 182, a second block pattern DAM2 spaced apart from the active region AAR with the first block pattern DAM1 interposed therebetween, and a third block pattern DAM3 spaced apart from the first block pattern DAM1 with the second block pattern DAM2 interposed therebetween may be disposed in the fourth non-active region NAR4. The block patterns DAM1, DAM2, and DAM3 may have an approximate line shape extending in the second direction DR2.

A fourth block pattern DAM4 closest to the encapsulation organic layer 182 and a fifth block pattern DAM5 spaced apart from the active region AAR, with the fourth block pattern DAM4 interposed therebetween, may be disposed in the first to third non-active regions NAR1 to NAR3. Each of the fourth block pattern DAM4 and the fifth block pattern DAM5 may extend primarily in the second non-active region NAR2 in the first direction DR1, extend primarily in the first non-active region NAR1 in the second direction DR2, and extend primarily in the third non-active region NAR3 in the first direction DR1 again.

As described above, since the plurality of block patterns of the display panel 10 form the closed curve surrounding the active region AAR in a plan view, all of the first to third block patterns DAM1 to DAM3 of the fourth non-active region NAR4 should be connected to at least one of the fourth block pattern DAM4 and the fifth block pattern DAM5 of the first to third non-active regions NAR1 to NAR3.

According to one exemplary embodiment of the present disclosure, the first block pattern DAM1 may be physically connected to the fourth block pattern DAM4, the second block pattern DAM2 may be physically connected to the fourth block pattern DAM4, and the third block pattern DAM3 may be physically connected to the fifth block pattern DAM5.

A connection between the second block pattern DAM2 and the fourth block pattern DAM4 of the third non-active region NAR3 may be made in the fourth non-active region NAR4 or the eighth non-active region NAR8 and might not be made in the third non-active region NAR3. As described above, this is because, since a dead space of the third non-active region NAR3 is narrowly designed, when the connection between the second block pattern DAM2 and the fourth block pattern DAM4 is made in the third non-active region NAR3, the narrowly designed dead space of the third non-active region NAR3 may be increased.

Similarly, a connection between the second block pattern DAM2 and the fourth block pattern DAM4 of the second non-active region NAR2 may be made in the fourth non-active region NAR4 or the seventh non-active region NAR7 and might not be made in the second non-active region NAR2.

When each of the connection between the second block pattern DAM2 and the fourth block pattern DAM4 of the third non-active region NAR3 and the connection between the second block pattern DAM2 and the fourth block pattern DAM4 of the second non-active region NAR2 is made in the fourth non-active region NAR4, it may be considered that the fourth block pattern DAM4 is further disposed in all of the seventh non-active region NAR7 and the eighth non-active region NAR8 from connection parts between the second block pattern DAM2 and the fourth block pattern DAM4 in the fourth non-active region NAR4.

When each of the connection between the second block pattern DAM2 and the fourth block pattern DAM4 of the third non-active region NAR3 and the connection between the second block pattern DAM2 and the fourth block pattern DAM4 of the second non-active region NAR2 is made in the seventh non-active region NAR7 and the eighth non-active region NAR8, it may be considered that the fourth block pattern DAM4 is further disposed in the remaining portion of the seventh non-active region NAR7 and the remaining portion of the eighth non-active region NAR8 from connection pans between the second block pattern DAM2 and the fourth block pattern DAM4 in the seventh non-active region NAR7 and the eighth non-active region NAR8.

The above-described first and second pad portions PA1 and PA2 may be disposed in the sub-region SR.

Hereinafter, the detailed cross-sectional structure of the display panel 10 will be described.

Figure 8:
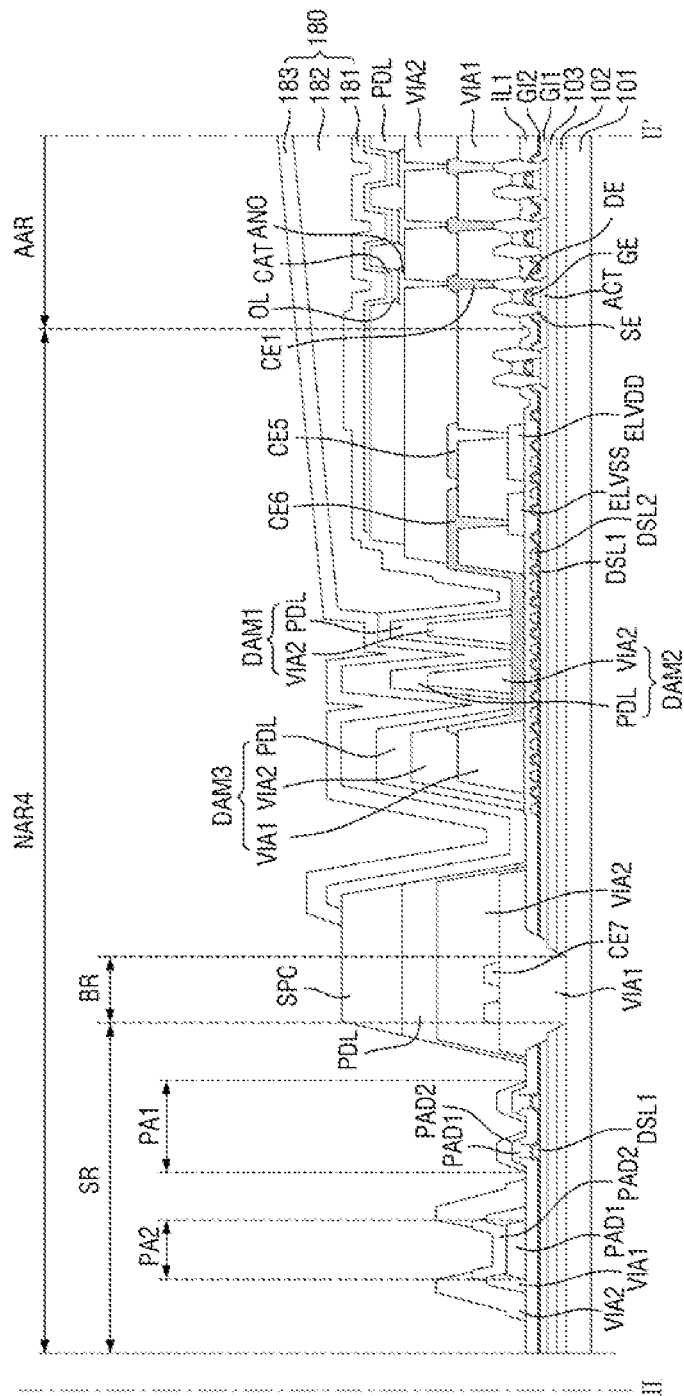
FIG. 8 is a cross-sectional view taken along line II-II' of FIG. 6.

FIG. 7 is a cross-sectional view taken along line I-I' of FIG. 6, and FIG. 8 is a cross-sectional view taken along line II-II' of FIG. 6.

Referring to FIGS. 7 and 8, the display panel 10 may include the substrate 101, buffer layers 102 and 103, insulating layers GI1, GI2, IL1, VIA1, and VIA2, a bank layer PDL, conductive layers, an organic layer OL, the encapsulation layer 180, and the block patterns DAM1, DAM2, DAM3, DAM4, and DAM5.

The substrate 101 may include a flexible organic material. Although not shown, the substrate 101 may include a plurality of stacked films.

A first buffer layer 102 and a second buffer layer 103 may be sequentially disposed on the substrate 101. The buffer layers 102 and 103 may each include an inorganic material. An example of the inorganic material may include silicon nitride, silicon oxide, silicon oxynitride, or the like. For example, the first buffer layer 102 may include silicon nitride and the second buffer layer 103 may include silicon oxide, but the present disclosure is not necessarily limited thereto.

A semiconductor layer ACT may be disposed on the second buffer layer 103. The semiconductor layer ACT may be disposed in the active region AAR. In some exemplary embodiments of the present disclosure, the semiconductor layer ACT may be further disposed in the non-active region NAR3 (or see "NAR2" of FIG. 5) in which the above-described driving circuit is disposed.

A first gate insulating layer GI1 may be disposed on the semiconductor layer ACT. The first gate insulating layer GI1 may at least partially cover the semiconductor layer ACT. The first gate insluting layer GI1 may include an inorganic material. An example of the inorganic material may include silicon nitride, silicon oxide, silicon oxynitride, or the like.

A gate electrode of a thin film transistor or a driving circuit may be disposed on the first gate insulating layer GI1. In FIG. 7, a gate electrode GE of the thin film transistor is illustrated.

The semiconductor layer ACT may include a channel region at least partially overlapping the gate electrode GE.

A plurality of first data connection lines DSL1 disposed in the fourth non-active region NAR4 may be disposed on the first gate insulating layer GI1. The first data connection lines DSL1 may be disposed in the first pad portion PA1 and between the bending region BR and the active region AAR. The first data connection line DSL1 disposed in the first pad portion PA1 may be electrically connected to the first data connection line DSL1 disposed between the bending region BR and the active region AAR. The first data connection line DSL1 disposed in the first pad portion PA1 may be electrically connected to a first pad PAD1.

The first data connection line DSL1 and the gate electrode GE may be formed through the same process and may include the same material.

The gate electrode GE may include at least one metal selected from among molybdenum (Mo), aluminum (Al), platinum (Pt), palladium (Pd), silver (Ag), magnesium (Mg), gold (Au), nickel (Ni), neodymium (Nd), iridium (Ir), chromium (CT), calcium (Ca), titanium (Ti), tantalum (Ta), tungsten (W), and copper (Cu). The gate electrode GE may be a single film made of at least one selected from among the above-described materials. The present disclosure is not necessarily limited thereto, and the gate electrode GE may be a stacked film.

A second gate insulating layer GI2 may be disposed on the gate electrode GE. The second gate insulating layer GI2 may perform a function of insulating the gate electrode GE from a source electrode SE and a drain electrode DE, which will be described below. In addition, the second gate insulating layer GI2 may perform a function of insulating the first data connection line DSL1 from a second data connection line DSL2. The second gate insulating layer GI2 may be exposed at the first pad portion PA1, and thus, the first data connection line DSL1 and the first pad PAD1 may be in electrical contact with each other.

The second gate insulating layer GI2 may include at least one selected from among the above-described materials of the first gate insulating layer GI1.

The second data connection line DSL2 may be disposed on the second gate insulating layer GI2. The second data connection line DSL2 may be disposed between the bending region BR and the active region AAR. Although not shown, the second data connection line DSL2 may be electrically connected to the first data connection line DSL1 disposed in the first pad portion PA1.

The second data connection line DSL2 may include at least one metal selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The second data connection line DSL2 may be a single film made of at least one selected from among the above-described materials. The present disclosure is not necessarily limited thereto, and the second data connection line DSL2 may be a stacked film.

A first insulating layer IL1 may be disposed on the second data connection line DSL2. The first insulating layer IL1 may expose an upper surface of the first data connection line DSL1 in the first pad portion PA1 like the second gate insulating layer GI2.

The first insulating layer IL1 may include an inorganic material. An example of the inorganic material may include silicon nitride, silicon oxide, silicon oxynitride, or the like.

The source electrode SE and the drain electrode DE may each be disposed on the first insulating layer IL1. The source electrode SE and the drain electrode DE may each be disposed in the active region AAR. The source electrode SE and the drain electrode DE may each be electrically connected to the semiconductor layer ACT through contact holes through which the first insulating layer IL1 and the gate insulating layers GI1 and GI2 are exposed.

The source electrode SE, the drain electrode DE, the gate electrode GE, and the semiconductor layer ACT may together constitute a thin film transistor. The source electrode SE and the drain electrode DE may each be disposed in the active region AAR.

A low voltage supply line ELVSS and a high voltage supply line ELVDD may each be further disposed between the active region AAR and the bending region BR. The low voltage supply line ELVSS may be further disposed in the third non-active region NAR3. Each of the low voltage supply line ELVSS and the high voltage supply line ELVDD may be coplanar with the source electrode SE, may be formed through the same process as that of the source electrode SE, and may include the same material as that of the source electrode SE.

The first pad PAD1 may be disposed in each of the pad portions PA1 and PA2. The first pad PAD1 may be coplanar with the source electrode SE, may be formed through the same process as that of the source electrode SE, and may include the same material as that of the source electrode SE.

The first pad PAD1 disposed in the first pad portion PA1 may be electrically connected to the first data connection line DSL1.

The source electrode SE and the drain electrode DE may each include at least one metal selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The source electrode SE and the drain electrode DE may each be a single film made of at least one selected from among the above-described materials. The present disclosure is not necessarily limited thereto, and the source electrode SE and the drain electrode DE may each be a stacked film.

A first via layer VIA1 may be disposed on the source electrode SE, the drain electrode DE, the voltage supply lines ELVSS and ELVDD, and the first pad PAD1. The first via layer VIA1 disposed in the second pad portion PA2 may expose an upper surface of the first pad PAD1.

The first via layer VIA1 disposed in the fourth non-active region NAR4 between the bending region BR and the active region AAR may be disposed directly on the first insulating layer IL1. The first via layer VIA1 disposed in the non-active region NAR3 or NAR4 between the bending region BR and the active region AAR may constitute the third block pattern DAM3.

In addition, the first via layer VIA1 disposed in the third non-active region NAR3 may constitute the fifth block pattern DAM5.

Meanwhile, the first via layer VIA1 disposed in the bending region BR may be in direct contact with the substrate 101. For example, in the bending region BR, the first insulating layer IL1, the gate insulating layers GI1 and GI2, and the buffer layers 102 and 103 may each be removed, and thus, an upper surface of the substrate 101 may be exposed. The first via layer VIA1 may be in direct contact with the exposed upper surface of the substrate 101.

The first via layer VIA1 may include an organic insulating material such as a polyacrylate-based resin, an epoxy resin, a phenolic resin, a polyamide-based resin, a polyimide-based resin, an unsaturated polyester-based resin, a polyphenylenether-based resin, a polyphenylene sulfide-based resin, or benzocyclobutene (BCB).

A first connection electrode CE1, a second connection electrode CE2, a fifth connection electrode CE5, a sixth connection electrode CE6, and a seventh connection electrode CE7 may be disposed on the first via layer VIA1. The first connection electrode CE1, the second connection electrode CE2, the fifth connection electrode CE5, the sixth connection electrode CE6, and the seventh connection electrode CE7 may all be disposed on the same layer, may all be formed through the same process, and may each include the same material.

The first connection electrode CE1 may be electrically connected to the drain electrode DE exposed by the first via layer VIA1 in the active region AAR.

The second connection electrode CE2 may be electrically connected to the low voltage supply line ELVSS exposed by the first via layer VIA1 in the third non-active region NAR3.

The fifth connection electrode CE5 and the sixth connection electrode CE6 may be electrically connected to the high voltage supply line ELVDD and the low voltage supply line ELVSS exposed by the first via layer VIA1 between the bending region BR and the active region AAR, respectively.

The first via layer VIA1 may be exposed between the bending region BR and the active region AAR (for example, between the third block pattern DAM3 and the low voltage supply line ELVSS, for example, a region in which the first block pattern DAM1 and the second block pattern DAM2, which will be described below, are disposed). The sixth connection electrode CE6 may be in direct contact with the first insulating layer IL1 in the region in which the first via layer VIA1 is exposed.

The seventh connection electrode CE7 may be disposed on the first via layer VIA1 in the bending region BR. Although not shown, the seventh connection electrode CE7 may serve to electrically connect the first data connection line DSL1 of the first pad portion PA1 and the first data connection line DSL1 or the second data connection line DSL2 between the bending region BR and the active region AAR.

Second pads PAD2 may be further disposed in the pad portions PA1 and PA2. The second pad PAD2 may be coplanar with the first connection electrode CE1, may be formed through the same process as that of the first connection electrode CE1, and may include the same material as that of the first connection electrode CE1.

The second pad PAD2 may be electrically connected to the first pad PAD1 in the pad portions PA1 and PA2.

The first connection electrode CE1, the second connection electrode CE2, the fifth connection electrode CE5, the sixth connection electrode CE6, and the seventh connection electrode CE7 may be present. The first connection electrode CE1, the second connection electrode CE2, the fifth connection electrode CE5, the sixth connection electrode CE6, and the seventh connection electrode CE7 may include at least one metal selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The first connection electrode CE1, the second connection electrode CE2, the fifth connection electrode CE5, the sixth connection electrode CE6, and the seventh connection electrode CE7 may be present. The first connection electrode CE1, the second connection electrode CE2, the fifth connection electrode CE5, the sixth connection electrode CE6, and the seventh connection electrode CE7 may each be a single film made of at least one selected from among the above-described materials. The present disclosure is not necessarily limited thereto, and the first connection electrode CE1, the second connection electrode CE2, the fifth connection electrode CE5, the sixth connection electrode CE6, and the seventh connection electrode CE7 may be present. The first connection electrode CE1, the second connection electrode CE2, the fifth connection electrode CE5, the sixth connection electrode CE6, and the seventh connection electrode CE7 may each be a stacked film.

The first connection electrode CE1, the second connection electrode CE2, the fifth connection electrode CE5, the sixth connection electrode CE6, and the seventh connection electrode CE7 may be present. A second via layer VIA2 may be disposed on the first connection electrode CE1, the second connection electrode CE2, the fifth connection electrode CE5, the sixth connection electrode CE6, the seventh connection electrode CE7, and the first pad PAD1.

The second via layer VIA2 may expose an upper surface of the first connection electrode CE1 in the active region AAR, and the exposed first connection electrode CE1 may be electrically connected to an anode ANO which will be described below.

The second via layer VIA2 may be disposed on the second connection electrode CE2 in the third non-active region NAR3 and may at least partially overlap the second connection electrode CE2. The second via layer VIA2 at least partially overlapping the second connection electrode CE2 may constitute the fourth block pattern DAM4.

The second via layer VIA2 may be further disposed on the first via layer VIA1 constituting the fifth block pattern DAM5 in the third non-active region NAR3 so as to at least partially overlap the corresponding first via layer VIA1. The second via layer VIA2 at least partially overlapping the corresponding first via layer VIA1 may constitute the fifth block pattern DAM5.

The second via layer VIA2 may be further disposed on the first via layer VIA1 constituting the third block pattern DAM3 in the fourth non-active region NAR4 so as to at least partially overlap the corresponding first via layer VIA1. The corresponding second via layer VIA2 may constitute the third block pattern DAM3.

The second via layer VIA2 may constitute each of the first block pattern DAM1 and the second block pattern DAM2 on the sixth connection electrode CE6 in direct contact with the first insulating layer IL1 in a region of the fourth non-active region NAR4 exposed between the bending region BR and the active region AAR (for example, between the third block pattern DAM3 and the low voltage supply line ELVSS, for example, a region in which the first block pattern DAM1 and the second block pattern DAM2, which will be described below, are disposed).

The second via layer VIA2 constituting each of the block patterns DAM3 and DAM5 may cover, not only an upper surface of the first via layer VIA1 at least partially overlapping the second via layer VIA2, but also side surfaces thereof.

The second via layer VIA2 may expose an upper surface of the second pad PAD2 in the second pad portion PA2.

In the bending region BR, the second via layer VIA2 may cover the seventh connection electrode CE7 and may be in direct contact with the first via layer VIA1 exposed by the seventh connection electrode CE7.

The anode ANO may be disposed on the second via layer VIA2. The anode ANO may be a pixel electrode disposed for each pixel. The anode ANO may have a stacked film structure formed by stacking material layers having a high work function and a reflective material layer, wherein the material layer is made of one selected from among indium tin oxide (ITO), indium zinc oxide (IZO), zinc oxide (ZnO), and indium oxide ($In_2O_3$), and the reflective material layer is made of one selected from among silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), and a mixture thereof. The material layer having a high work function may be disposed on the reflective material layer and may be disposed close to the light-emitting layer. The anode ANO may have a multilayer structure of ITO/Mg, ITO/MgF, ITO/Ag, or ITO/Ag/ITO, but the present disclosure is not necessarily limited thereto.

Connection electrodes CE3 and CE4 may be further disposed on the second via layer VIA2 in the third non-active region NAR3. The connection electrodes CE3 and CE4 may be coplanar with the anode ANO, may be formed through the same process as that of the anode ANO, and may include the same material as that of the anode ANO.

A fourth connection electrode CE4 may be disposed between the fifth block pattern DAM5 and the fourth block pattern DAM4 and may partially cover upper surfaces of the fifth block pattern DAM5 and the fourth block pattern DAM4.

A third connection electrode CE3 may be disposed between the fourth block pattern DAM4 and the adjacent second via layer VIA2. Bach of the third connection electrode CE3 and the fourth connection electrode CE4 may be in direct contact with an upper surface of the low voltage supply line ELVSS.

The bank layer PDL may be disposed on the substrate 101. The bank layer PDL may be disposed on the anode ANO and may have an opening that exposes the anode ANO. An emission region and a non-emission region may be divided by the bank layer PDL and the opening thereof. The bank layer PDL may include an organic insulating material such as a polyacrylate-based resin, an epoxy resin, a phenolic resin, a polyamide-based resin, a polyimide-based resin, an unsaturated polyester-based resin, a polyphenylene-nether-based resin, a polyphenylene sulfide-based resin, or BCB. The bank layer PDL may include an inorganic material.

The bank layer PDL may at least partially overlap the second via layer VIA2 constituting the fourth block pattern DAM4 to constitute the fourth block pattern DAM4.

The bank layer PDL may at least partially overlap the second via layer VIA2 constituting the fifth block pattern DAM5 to constitute the fifth block pattern DAM5.

The bank layer PDL may at least partially overlap the second via layer VIA2 constituting the first to third block patterns DAM1 to DAM3 to constitute the first to third block patterns DAM1 to DAM3.

The bank layer PDL may at least partially overlap the second via layer VIA2 in the bending region BR.

A spacer SPC may be disposed on the bank layer PDL. The spacer SPC may be disposed on the bank layer PDL constituting the fourth block pattern DAM4 and the fifth block pattern DAM5 to constitute each of the fourth block pattern DAM4 and the fifth block pattern DAM5.

The spacer SPC may at least partially overlap the bank layer PDL in the bending region BR.

The spacer SPC may include a material different from that of the bank layer PDL thereunder. In some exemplary embodiments of the present disclosure, the spacer SPC and the bank layer PDL thereunder may include the same material and may be formed through the same process. For example, after a bank layer material is deposited, the bank layer material may be masked using a slit mask or a halftone mask, and then, exposure and development may be performed thereon to form the bank layer PDL and the spacer SPC. A slit mask or a halftone mask might not be used, and exposure and development may be performed to form the bank layer PDL on which the spacer SPC is not disposed.

The first block pattern DAM1 and the second block pattern DAM2 may have a stacked structure of the second via layer VIA2 and the bank layer PDL. The third block pattern DAM3 may have a stacked structure of the first via layer VIA1, the second via layer VIA2, and the bank layer PDL, and the fourth block pattern DAM4 may have a stacked structure of the second via layer VIA2, the bank layer PDL, and the spacer SPC. The fifth block pattern DAM5 may have a stacked structure of the first via layer VIA1, the second via layer VIA2, the bank layer PDL, and the spacer SPC.

A surface height of the third block pattern DAM3 may be greater than each of a surface height of the first block pattern DAM1 and a surface height of the second block pattern DAM2. A surface height of the fifth block pattern DAM5 may be greater than or equal to a surface height of the fourth block pattern DAM4.

The light-emitting layer is disposed on the anode ANO exposed by the bank layer PDL. The light-emitting layer may include an organic layer OL. The organic layer OL may include an organic light-emitting layer and may further include a hole injection/transport layer and/or an election injection/transport layer.

An emission wavelength of light emitted by each light-emitting layer may vary according to each color pixel. For example, the light-emitting layer may include a first color light-emitting layer disposed in an emission region EMA_R of a first color pixel, a second color light-emitting layer disposed in an emission region EMA_B of a second color pixel, and a third color light-emitting layer disposed in an emission region EMA_G of a third color pixel. The first color light-emitting layer may emit light in a red wavelength range, the second color light-emitting layer may emit light in a blue wavelength range, and the third color light-emitting layer may emit light in a green wavelength range.

A cathode CAT may be disposed on the light-emitting layer. The cathode CAT may be a common electrode disposed in all of the pixels without distinction of the pixels (e.g. the single cathode CAT may continue, uninterrupted, through all of the pixels). The anode ANO, the light-emitting layer, and the cathode CAT may constitute an organic light-emitting element.

The cathode CAT may be m contact with nor only the light-emitting layer but also an upper surface of the bank layer PDL. The cathode CAT may be conformally formed with respect to a lower structure so as to reflect a stepped portion of the lower structure.

The cathode CAT may include a material layer having a low work function, such as Li, Ca, LiF/Ca, LiF/Al, Al, Mg, Ag, Pt, Pd, Ni, Au Nd, Ir, Cr, BaF, Ba, or a compound or mixture thereof (for example, a mixture of Ag and Mg). As used herein, the phrase "low work function" is understood to mean a work function that is the same as or lower than any of the aforementioned materials that are offered herein as examples of low work function materials. The cathode CAT may further include a transparent metal oxide layer disposed on the material layer having a low work function.

The cathode CAT may be electrically connected to the second connection electrode CE2 in the third non-active region NAR3.

The encapsulation layer 180, including the first encapsulation inorganic layer 181, the encapsulation organic layer 182, and a second encapsulation inorganic layer 183, is disposed on the cathode CAT. The first encapsulation inorganic layer 181 and the second encapsulation inorganic layer 183 may each include silicon nitride, silicon oxide, silicon oxynitride, or the like. The encapsulation organic layer 182 may include an organic insulating material such as a polyacrylate-based resin, an epoxy resin, a phenolic resin, a polyamide-based resin, a polyimide-based resin, an unsaturated polyester-based resin, a polyphenylenether-based resin, a polyphenylene sulfide-based resin, or BCB.

The first encapsulation inorganic layer 181 may be disposed on entire surfaces of the active region AAR and the non-active regions NAR3 and NAR4. The first encapsulation inorganic layer 181 may be in direct contact with each of the block patterns DAM1 to DAM5.

The encapsulation organic layer 182 may be disposed over the active region AAR and disposed inside of the block patterns. In FIGS. 7 and 8, the encapsulation organic layer 182 is illustrated as being disposed inside of the fourth block pattern DAM4 and the fifth block pattern DAM5.

The second encapsulation inorganic layer 183 may be disposed on the encapsulation organic layer 182 and the first encapsulation inorganic layer 181. The second encapsulation inorganic layer 183 may be in direct contact with the encapsulation organic layer 182 at a portion in which the second encapsulation inorganic layer 183 at least partially overlaps the encapsulation organic layer 182 and may be in direct contact with the first encapsulation inorganic layer 181 at a portion in which the second encapsulation inorganic layer 183 does not overlap the encapsulation organic layer 182. For example, the encapsulation inorganic layers 181 and 183 may be disposed outward as compared with the encapsulation organic layer 182 and may at least partially surround the encapsulation organic layer 182 in a plan view.

As described above, the plurality of block patterns forming the closed curve may completely surround the encapsulation organic layer 182 in a plan view. After the first encapsulation inorganic layer 181 is formed, an encapsulation organic layer material is formed on the first encapsulation inorganic layer 181, and the encapsulation organic layer material may be reflowed in an outward direction of the display panel 10 (a direction from the active region AAR to the non-active region). The plurality of block patterns may form the closed curve completely surrounding the encapsulation organic layer in a plan view, thereby mitigating the reflow of the encapsulation organic layer material in the outward direction of the display panel 10.

In addition, in the display panel 10 according to one exemplary embodiment of the present disclosure, the number of the block patterns disposed in the fourth non-active region NAR4 may be different from the number of the block patterns disposed in the first to third non-active regions NAR1 to NAR3. The number of the block patterns disposed in the fourth non-active region NAR4 may be more than the number of the block patterns disposed in the first to third non-active regions NAR1 to NAR3.

Therefore, the number of the block patterns may be further increased in the fourth non-active region NAR4 having a relatively wide free space (as compared to that of the other non-active areas) for increasing the number of the block patterns, thereby further mitigating the reflow of the encapsulation organic layer material in at least the fourth non-active region NAR4.

Figure 9:
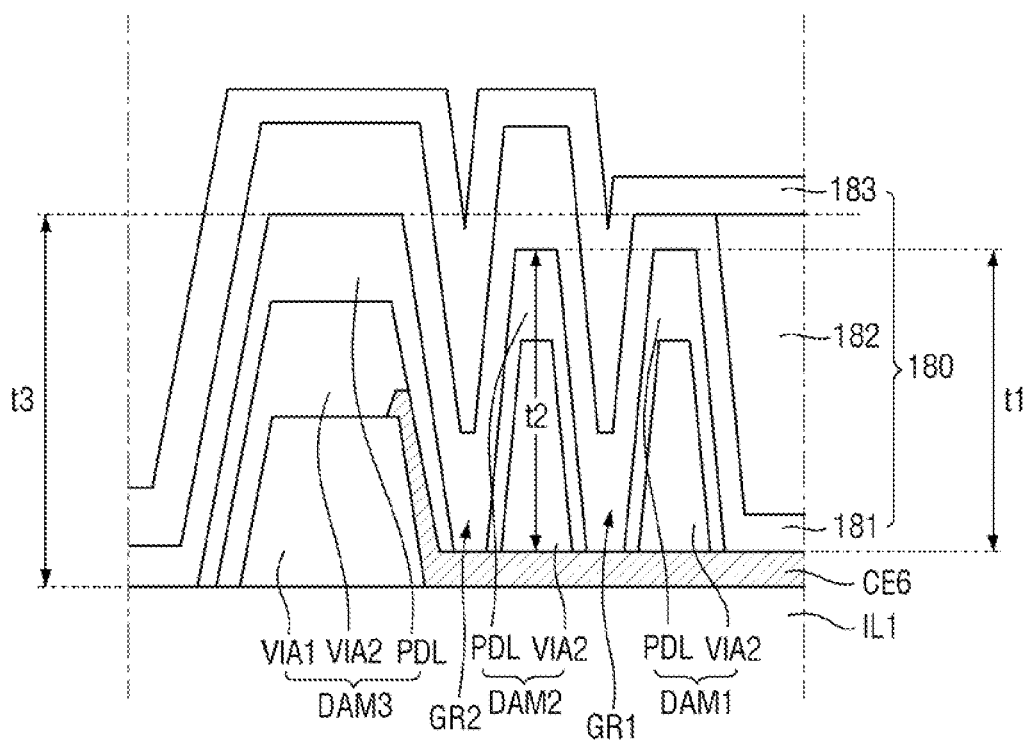
FIG. 9 is an enlarged view of a portion of FIG. 8.

FIG. 9 is an enlarged view of a portion of FIG. 8.

The surface height of the third block pattern DAM3 may be greater than the surface height of the first block pattern DAM1 and the surface height of the second block pattern DAM2.

A thickness t3 of the third block pattern DAM3 may be greater than a thickness t1 of the first block pattern DAM1 and a thickness t2 of the second block pattern DAM2.

The first block pattern DAM1 and the second block pattern DAM2 may be spaced apart from each other with a first grooves GR1 formed therebetween, and the second block pattern DAM2 and the third block pattern DAM3 may be spaced apart from each other with a second groove GR2 formed therebetween.

Figure 10:
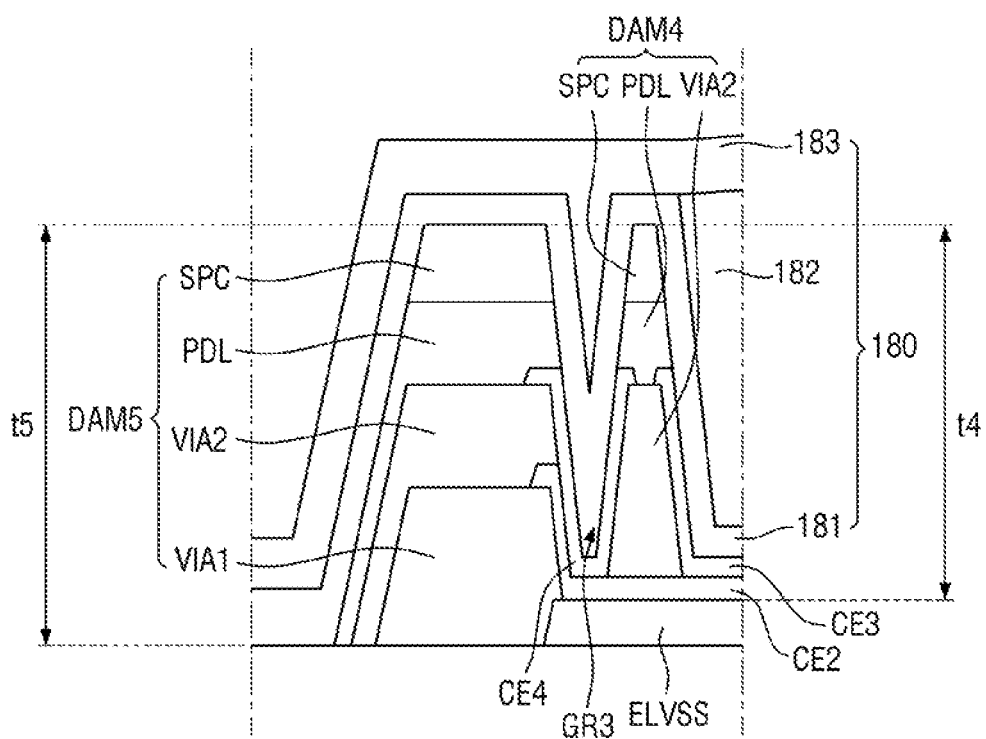
FIG. 10 is an enlarged view of a portion of FIG. 7.

FIG. 10 is an enlarged view of a portion of FIG. 7.

Referring to FIG. 10, the surface height of the fifth block pattern DAM5 may be greater than or equal to the surface height of the fourth block pattern DAM4.

When the surface height of the fifth block pattern DAM5 is equal to the surface height of the fourth block pattern DAM4, a thickness t5 of the fifth block pattern DAM5 may be greater than a thickness t4 of the fourth block pattern DAM4. When the surface height of the fifth block pattern DAM5 is greater than the surface height of the fourth block pattern DAM4, the thickness t5 of the fifth block pattern DAM5 may be greater than or equal to the thickness t4 of the fourth block pattern DAM4.

The fourth block pattern DAM4 and the fifth block pattern DAM5 may be spaced apart from each other with a third groove GR3 formed therebetween.

A stacked film constituting a stacked structure of the block patterns DAM1 to DAM5 of FIGS. 9 and 10 may be variously modified.

In some exemplary embodiments of the present disclosure, the first block pattern DAM1 and the second block pattern DAM2 may have a stacked structure of the first via layer VIA1 and the bank layer PDL or may have a stacked structure of the first via layer VIA1 and the second via layer VIA2.

In some exemplary embodiments of the present disclosure, the fourth block pattern DAM4 may have a stacked structure of the first via layer VIA1, the bank layer PDL, and the spacer SPC, may have a stacked structure of the first via layer VIA1, the second via layer VIA2, and the spacer SPC, or may have a stacked structure of the first via layer VIA1, the second via layer VIA2, and the bank layer PDL.

In some exemplary embodiments of the present disclosure, the spacer SPC of the fourth block pattern DAM4 and the fifth block pattern DAM5 may be omitted.

In some exemplary embodiments of the present disclosure, the spacer SPC may be further stacked in the first to third block patterns DAM1 to DAM3.

FIGS. 11 to 14 are views illustrating modified examples of FIG. 9.

Figure 11:
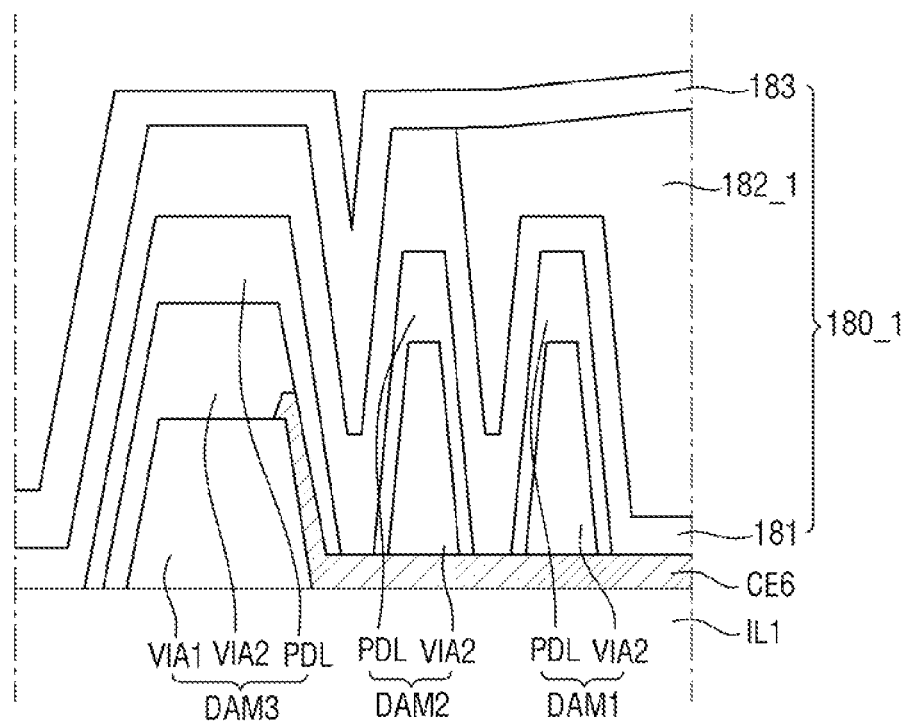
FIGS. 11 to 14 are views illustrating modified examples of FIG. 9.

Referring to FIG. 11, an encapsulation organic layer 182_1 of an encapsulation layer 180_1 may at least partially overlap a first block pattern DAM1 and may expand to a portion between the first block pattern DAM1 and a second block pattern DAM2.

Figure 12:
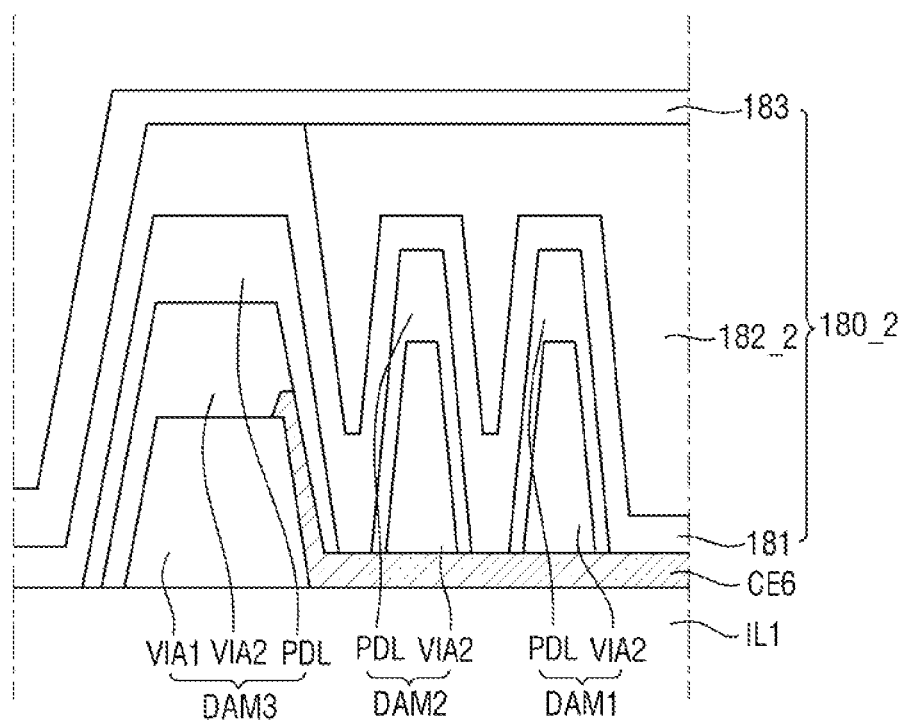

Referring to FIG. 12, an encapsulation organic layer 182_2 of an encapsulation layer 180_2 may at least partially overlap a first block pattern DAM1 and a second block pattern DAM2 and may expand to a portion between the second block pattern DAM2 and a third block pattern DAM3.

Figure 13:
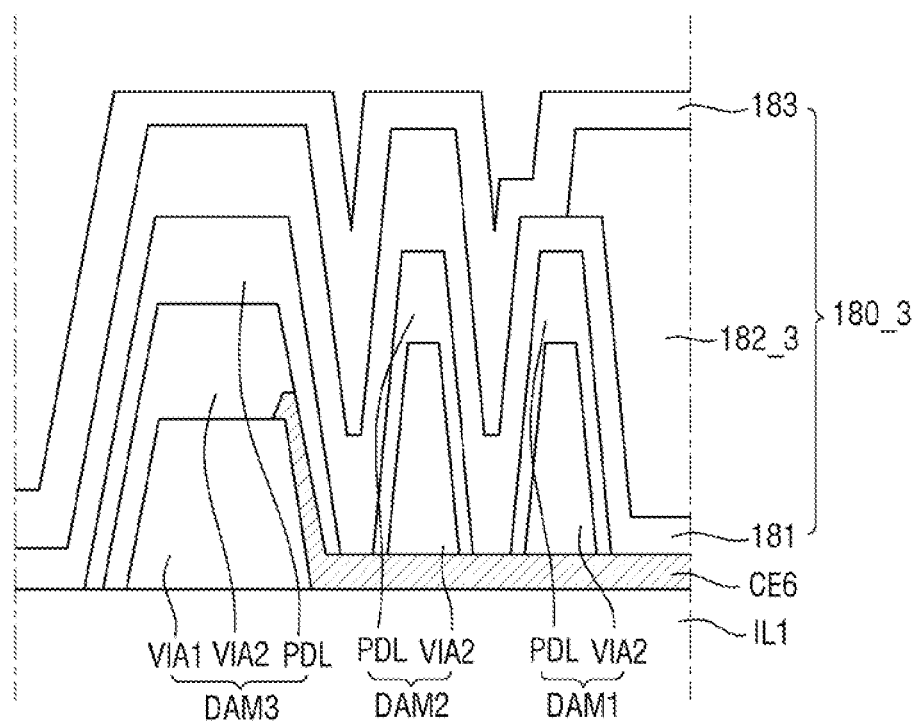

Referring to FIG. 13, an encapsulation organic layer 182_3 of an encapsulation layer 180_3 may at least partially overlap a portion of a first block pattern DAM1 and not overlapping the remaining portion of the first block pattern DAM1.

Figure 14:
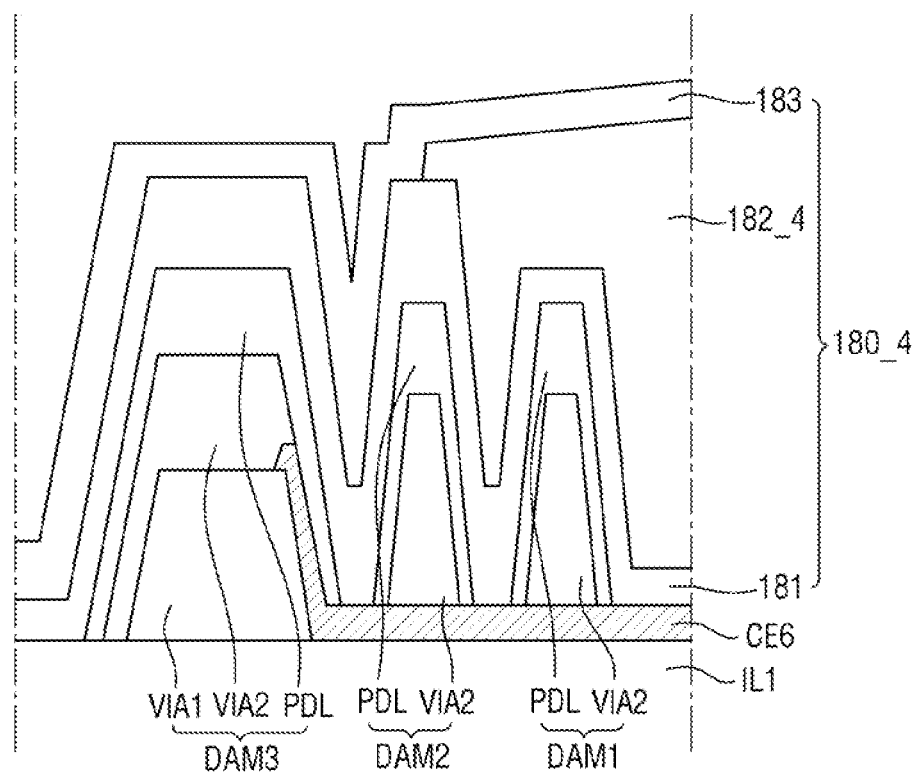

Referring to FIG. 14, an encapsulation organic layer 182_4 of an encapsulation layer 180_4 may completely overlap a first block pattern DAM1 and may at least partially overlap a portion of a second block pattern DAM2 and not overlap the remaining portion of the second block pattern DAM2.

Figure 15:
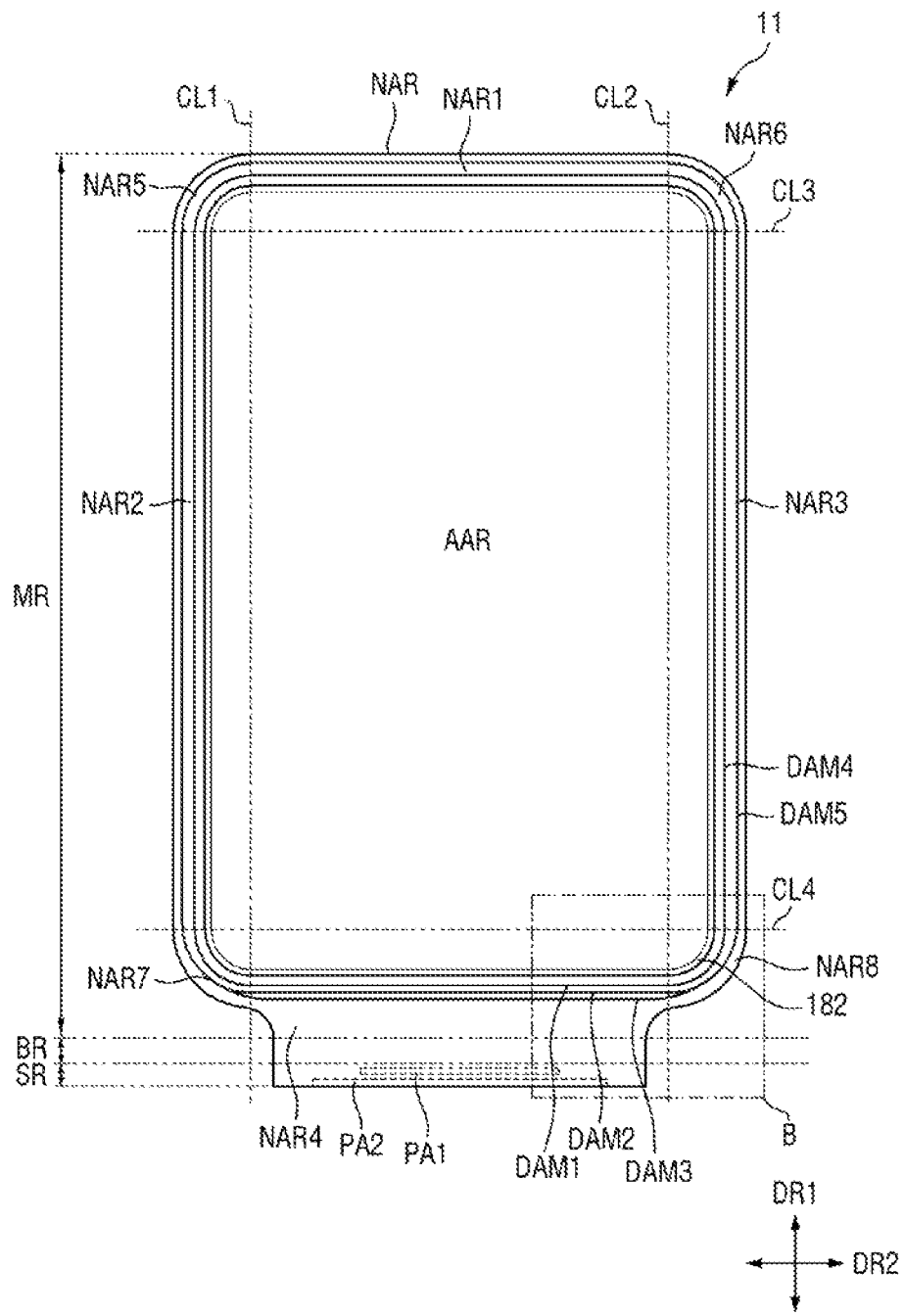
FIG. 15 is a plan view illustrating a display panel which illustrates a block pattern and an encapsulation organic layer according to an exemplary embodiment of the present disclosure.
Figure 16:
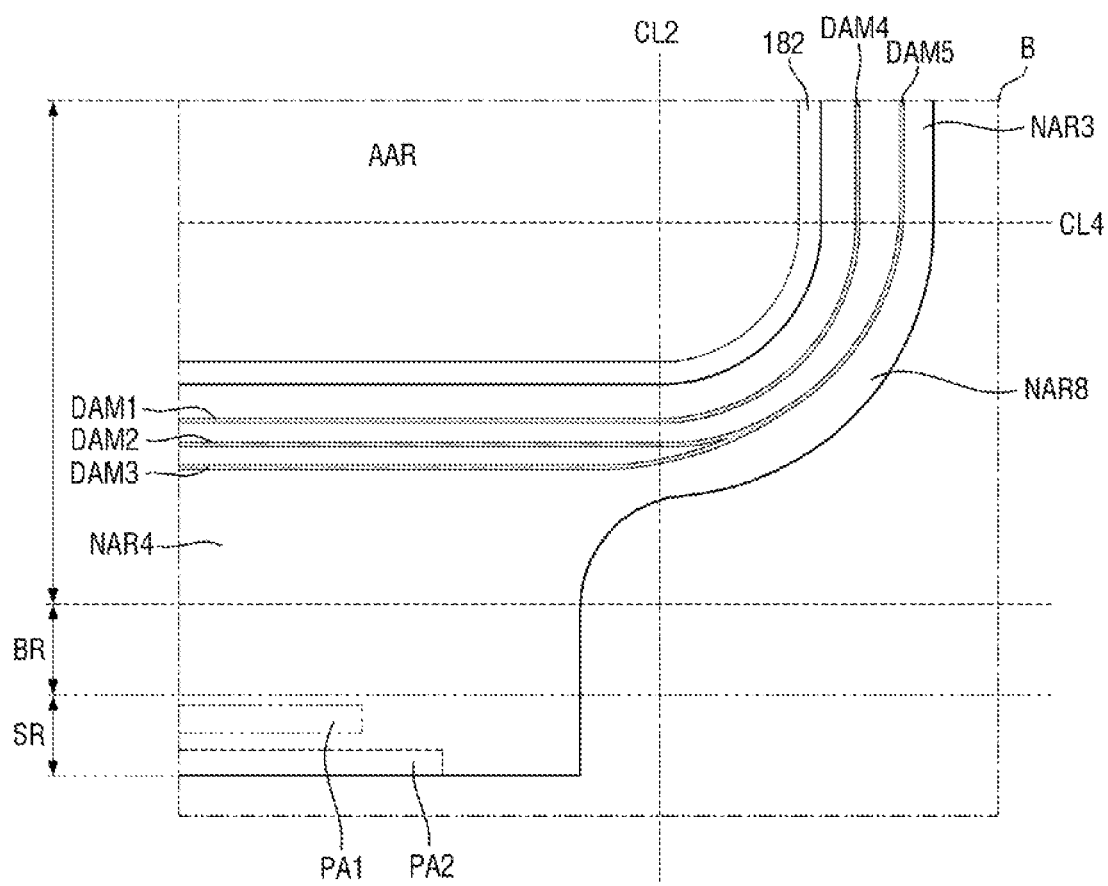
FIG. 16 is an enlarged view illustrating region B of FIG. 15.

FIG. 15 is a plan view of a display panel 11 which illustrates a block pattern and an encapsulation organic layer 182 according to an exemplary embodiment of the present disclosure, and FIG. 16 is an enlarged view of region B of FIG. 15.

Referring to FIGS. 15 and 16, a display panel 11 according to the present exemplary embodiment of the present disclosure is different from the display panel 10 of FIGS. 5 and 6 in that a second block pattern DAM2 is physically connected to a fifth block pattern DAM5.

For example, a connection between the second block pattern DAM2 and the Fifth block pattern DAM5 of a third non-active region NAR3 may be made in a fourth non-active region NAR4 or an eighth non-active region NAR8 and might not be made in the third non-active region NAR3. As described above, this is because, since a dead space of the third non-active region NAR3 is narrowly designed, when the connection between the second block pattern DAM2 and the Fifth block pattern DAM5 is made in the third non-active region NAR3, the narrowly designed dead space of the third non-active region NAR3 may be increased.

Similarly, a connection between the second block pattern DAM2 and the fifth block pattern DAM5 of a second non-active region NAR2 may be made in the fourth non-active region NAR4 or a seventh non-active region NAR7 and might not be made in the second non-active region NAR2.

When each of the connection between the second block pattern DAM2 and the fifth block pattern DAM5 of the third non-active region NAR3 and the connection between the second block pattern DAM2 and the fifth block pattern DAM5 of the second non-active region NAR2 is made in the fourth non-active region NAR4, it may be considered that the fifth block pattern DAM5 is further disposed in all of the seventh non-active region NAR7 and the eighth non-active region NAR8 from connection parts between the second block pattern DAM2 and the fifth block pattern DAM5 in the fourth non-active region NAR4.

When each of the connection between the second block pattern DAM2 and the Fifth block pattern DAM5 of the third non-active region NAR3 and the connection between the second block pattern DAM2 and the fifth block pattern DAM5 of the second non-active region NAR2 is made in the seventh non-active region NAR7 and the eighth non-active region NAR8, it may be considered that the Fifth block pattern DAM5 is further disposed in the remaining portion of the seventh non-active region NAR7 and the remaining portion of the eighth non-active region NAR8 from connection parts between the second block pattern DAM2 and the fifth block pattern DAM5 in the seventh non-active region NAR7 and the eighth non-active region NAR8.

Figure 17:
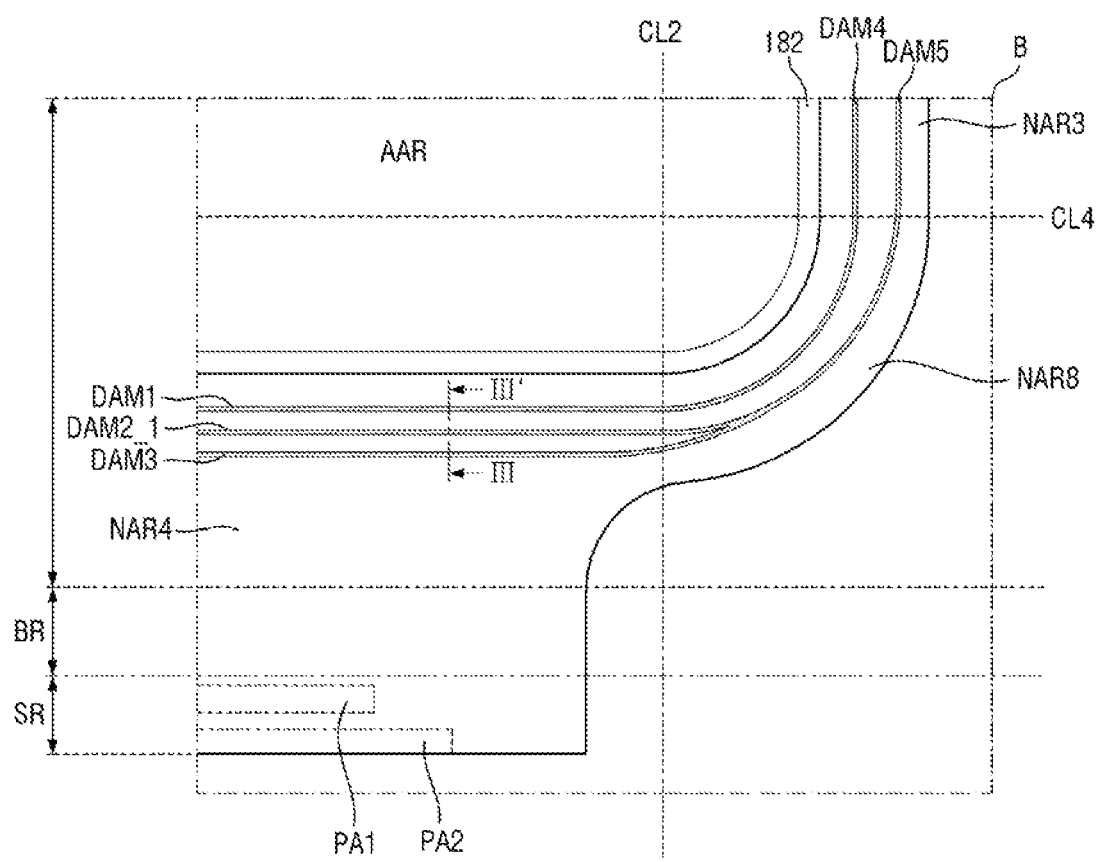
FIG. 17 is a partial plan view illustrating a display panel according to an exemplary embodiment of the present disclosure.
Figure 18:
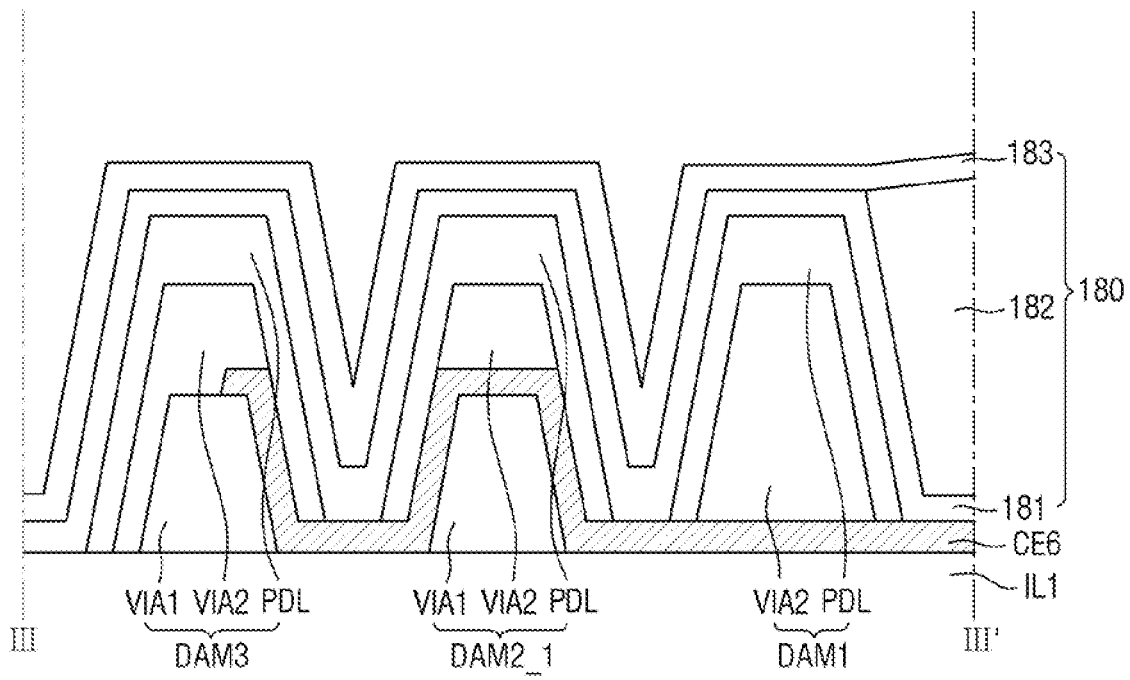
FIG. 18 is a cross-sectional view taken along line III-III' of FIG. 17.

FIG. 17 is a partial plan view of a display panel according to an exemplary embodiment of the present disclosure, and FIG. 18 is a cross-sectional view taken along line III-III' of FIG. 17.

Referring to FIGS. 17 and 18, the present exemplary embodiment of the present disclosure is different front the exemplary embodiment of the present disclosure of FIGS. 15 and 16 in that a second block pattern DAM2_1 has the same stacked structure as a third block pattern DAM3.

For example, the second block pattern DAM2_1 may have a stacked structure of a first via layer VIA1, a second via layer VIA2 on the first via layer VIA1, and a bank layer PDL.

FIG. 18 illustrates that a third connection electrode CE3 is disposed between the second via layer VIA2 and the bank layer PDL of the second block pattern DAM2_1 and thus the second via layer VIA2 and the bank layer PDL are not in contact with each other, but the present disclosure is not necessarily limited thereto. The third connection electrode CE3 might not overlap the second block pattern DAM2_1 or may at least partially overlap only a portion of an upper surface of the first via layer VIA1. In this case, the second via layer VIA2 and the bank layer PDL of the second block pattern DAM2_1 may be in contact with each other.

Figure 19:
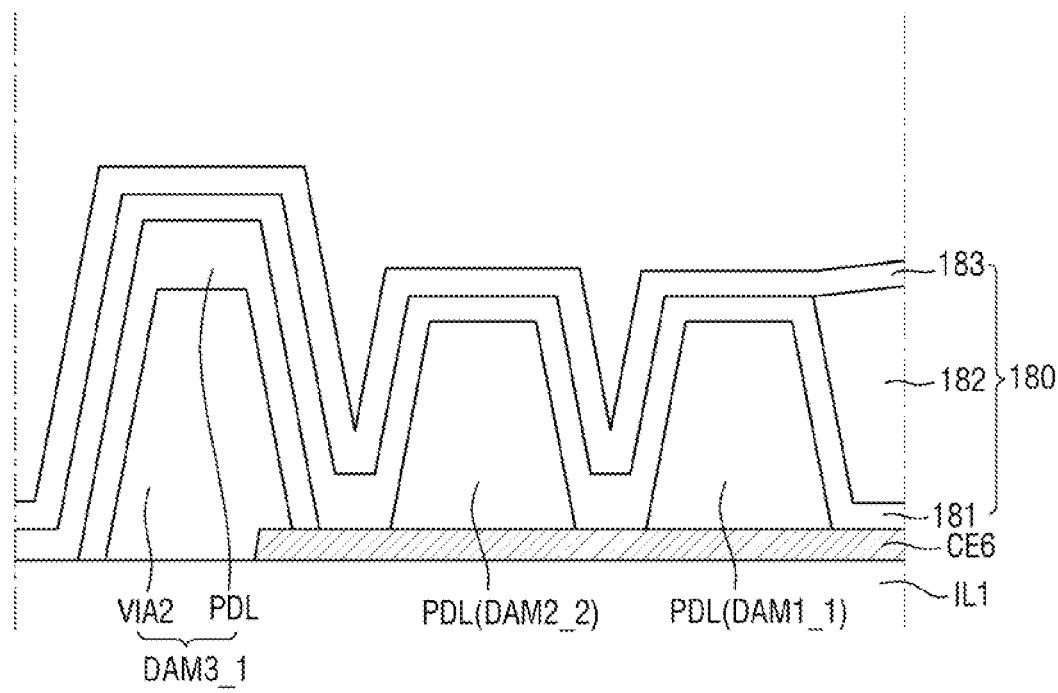
FIGS. 19 to 21 are views illustrating modified examples of FIG. 9.
Figure 20:
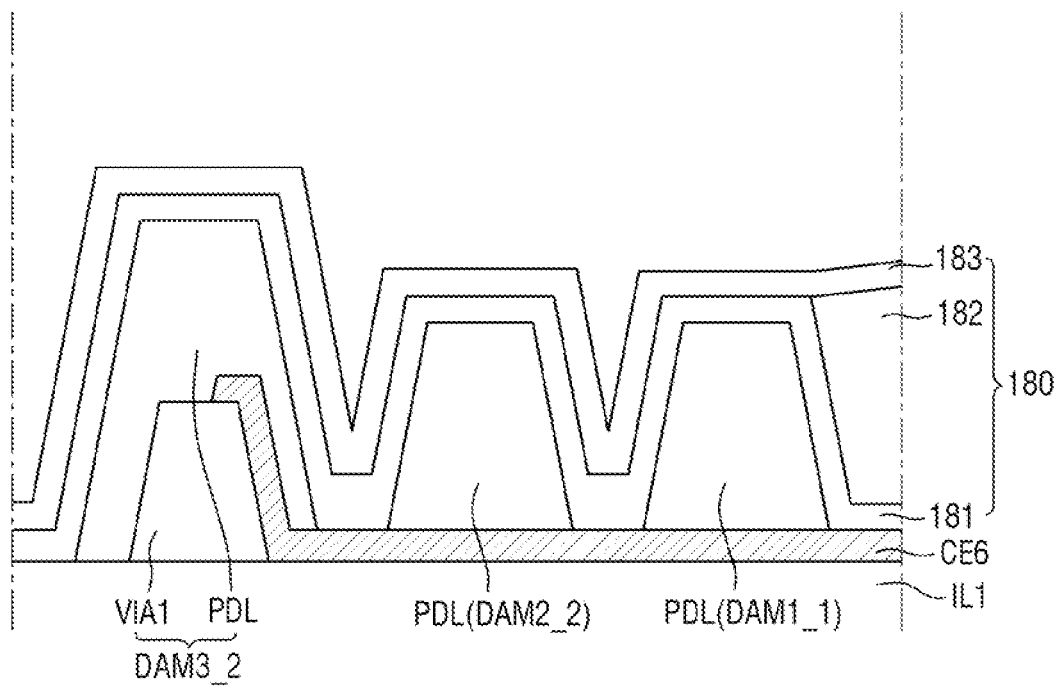
Figure 21:
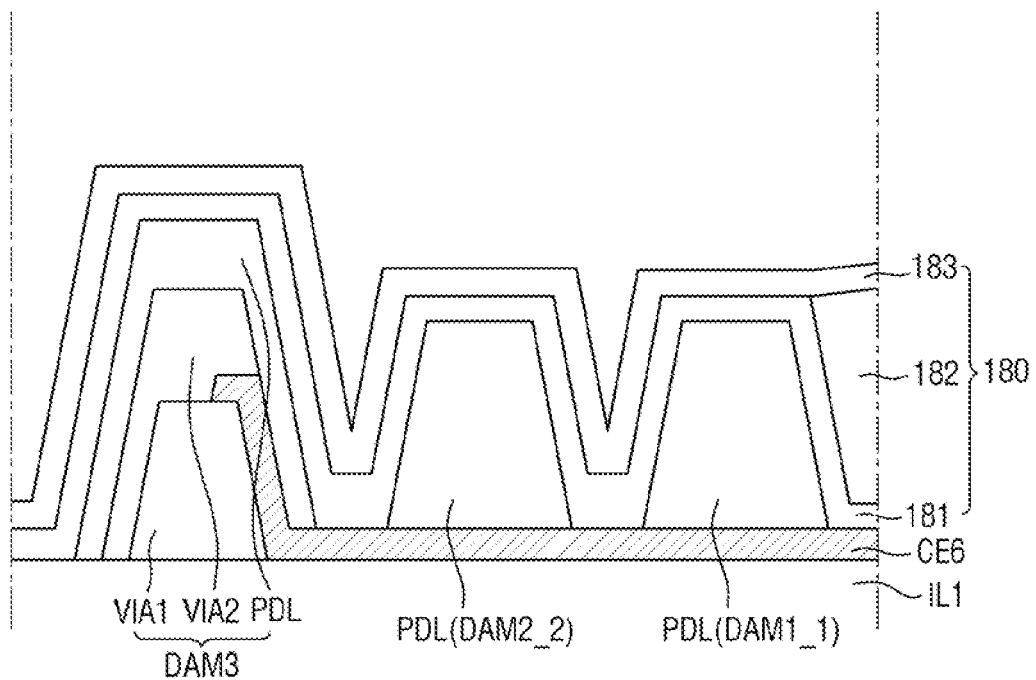

FIGS. 19 to 21 are views illustrating modified examples of FIG. 9.

Referring to FIG. 19, the present exemplary embodiment of the present disclosure is partially different from the exemplary embodiment of the present disclosure of FIG. 9 in that the number of stacked films of a first block pattern DAM1_1, a second block pattern DAM2_2, and a third block pattern DAM3_1 is reduced.

For example, the first block pattern DAM1_1 may be formed of a bank layer PDL, the second block pattern DAM2_2 may be formed of the bank layer PDL, and the third block pattern DAM3_1 may be formed of a second via layer VIA2 and the bank layer PDL.

Referring to FIG. 20, the present exemplary embodiment of the present disclosure is different from the exemplary embodiment of FIG. 19 in that a third block pattern DAM3_2 has a stacked structure of a first via layer VIA1 and a bank layer PDL instead of a stacked structure of a second via layer VIA2 and the bank layer PDL.

Referring to FIG. 21, the present exemplary embodiment of the present disclosure is different from the exemplary embodiment of FIG. 9 in that the first block pattern DAM1_1 and the second block pattern DAM2_2 of FIG. 19 are applied.

In a display device, according to one exemplary embodiment of the present disclosure, a greater number of block patterns is disposed at a lower side thereof less sensitive to a dead space, thereby controlling reflow of a thin film encapsulation structure.

Effects of the present disclosure are not restricted to the exemplary embodiments of the present disclosure set forth herein and more diverse effects are included in this specification.

Although embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A display device, comprising:
   a substrate including an active region and a non-active region at least partially surrounding the active region;
   a light-emitting element disposed in the active region on the substrate;
   an encapsulation layer disposed on the light-emitting element; and
   a plurality of block patterns disposed in the non-active region on the substrate and at least partially surrounding the active region,
   wherein the non-active region includes a first non-active region positioned at a first side of the active region and a second non-active region positioned at a second side of the active region,
   wherein there are more block patterns of the plurality of block patterns disposed in the first non-active region than in the second non-active region,
   wherein block patterns of the plurality of block patterns that are disposed in the first non-active region include a first block pattern, a second block pattern that is spaced apart from the active region with the first block pattern interposed therebetween, and a third block pattern that is spaced apart from the first block pattern with the second block pattern interposed therebetween, and
   wherein block patterns of the plurality of block patterns that are disposed in the second non-active region include a fourth block pattern and a fifth block pattern, wherein the fifth block pattern is spaced apart from the active region with the fourth block pattern interposed therebetween.

2. The display device of claim 1, wherein a planar shape of the plurality of block patterns includes a closed curve.

3. The display device of claim 2, wherein the encapsulation layer includes a first inorganic encapsulation layer, an organic encapsulation layer disposed on the first inorganic encapsulation layer, and a second inorganic encapsulation layer disposed on the organic encapsulation layer, and wherein the organic encapsulation layer is disposed inside of the plurality of block patterns.

4. The display device of claim 3, wherein the first block pattern is physically connected to the fourth block pattern, and wherein the third block pattern is physically connected to the fifth block pattern.

5. The display device of claim 4, wherein the second block pattern is physically connected to the fourth block pattern.

6. The display device of claim 5, wherein the active region has a rectangular planar shape having round corners, the rectangular shape having a pair of short sides, and a pair of long sides, wherein the first non-active region is disposed adjacent to one short side, of the pair of short sides, of the active region, and wherein the second non-active region is disposed adjacent to one long side, of the pair of long sides, of the active region.

7. The display device of claim 6, wherein the non-active region further includes a third non-active region disposed between the first non-active region and the second non-active region and disposed adjacent to one of the round corners of the active region, and wherein the second block pattern and the fourth block pattern are physically connected in either the first non-active region or the third non-active region.

8. The display device of claim 5, wherein the first non-active region further includes a bending region, and wherein the bending region is spaced apart from the active region with the third block pattern interposed therebetween.

9. The display device of claim 8, wherein, in the bending region, the display device is bent in a thickness direction thereof.

10. The display device of claim 9, wherein the third block pattern has a first stacked structure in which a first organic layer is stacked on the substrate, a second organic layer is stacked on the first organic layer, and a third organic layer is stacked on the second organic layer, and wherein the first block pattern and the second block pattern each have a second stacked structure in which the second organic layer and the third organic layer are stacked.

11. The display device of claim 10, further comprising a fourth organic layer disposed in the bending region on the substrate, wherein the fourth organic layer is in contact with the substrate and includes a same material as that of the first organic layer.

12. The display device of claim 4, wherein the second block pattern is physically connected to the fifth block pattern.

13. The display device of claim 1, wherein a surface height of the third block pattern is greater than each of a surface height of the first block pattern and a surface height of the second block pattern, and wherein a surface height of the fifth block pattern is greater than a surface height of the fourth block pattern.

14. The display device of claim 3, wherein the organic encapsulation layer is disposed inside of the third block pattern and inside of the fifth block pattern, and wherein the first inorganic encapsulation layer is in direct contact with each of the first block pattern, the second block pattern, and the third block pattern.

15. A display device, comprising:
a substrate including an active region and a non-active region at least p surrounding the active region;
a light-emitting element disposed in the active region on the substrate;
an encapsulation layer disposed on the light-emitting element; and
a plurality of block patterns disposed in the non-active region on the substrate and at least partially surrounding the active region,
wherein the non-active region includes a first non-active region positioned at a first side of the active region and a second non-active region positioned at a second side of the active region,
wherein the plurality of block patterns has a closed curve shape surrounding the active region,
wherein there are more block patterns of the plurality of block patterns disposed in the first non-active region than in the second non-active region,
wherein block patterns of the plurality of block patterns disposed in the first non-active region include a first block pattern, a second block pattern spaced apart from the active region with the first block pattern interposed therebetween, and a third block pattern spaced apart from the first block pattern with the second block pattern interposed therebetween, and
wherein block patterns of the plurality of block patterns disposed in the second non-active region include a fourth block pattern and a fifth block pattern spaced apart from the active region with the fourth block pattern interposed therebetween.

16. The display device of claim 15, wherein the encapsulation layer includes a first inorganic encapsulation layer, an organic encapsulation layer disposed on the first inorganic encapsulation layer, and a second inorganic encapsulation layer disposed on the organic encapsulation layer,
wherein the organic encapsulation layer is disposed inside of the plurality of block patterns.

17. The display device of claim 16, wherein the first block pattern is physically connected to the fourth block pattern, and wherein the third block pattern is physically connected to the fifth block pattern.

18. The display device of claim 17, wherein the second block pattern is physically connected to the fourth block pattern.

* * * * *